United States Patent
Huh et al.

(10) Patent No.: US 11,966,622 B2
(45) Date of Patent: Apr. 23, 2024

(54) MEMORY STORAGE DEVICE, AN OPERATION METHOD OF THE MEMORY STORAGE DEVICE, TEST METHOD AND ELECTRONIC DEVICE

(71) Applicant: Samsung Electronics Co., Ltd., Suwon-si (KR)

(72) Inventors: Sung Oh Huh, Suwon-si (KR); Jong Kyu Choi, Incheon (KR); Soo-Hyeong Kim, Hwaseong-si (KR); Dong Hee Kim, Seoul (KR); Young San Kang, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 100 days.

(21) Appl. No.: 17/690,163

(22) Filed: Mar. 9, 2022

(65) Prior Publication Data
US 2023/0056679 A1   Feb. 23, 2023

(30) Foreign Application Priority Data
Aug. 17, 2021   (KR) .................. 10-2021-0107788

(51) Int. Cl.
*G06F 3/06* (2006.01)
(52) U.S. Cl.
CPC .......... *G06F 3/0655* (2013.01); *G06F 3/0604* (2013.01); *G06F 3/0679* (2013.01)
(58) Field of Classification Search
CPC ........ G06F 3/06; G06F 3/0604; G06F 3/0655; G06F 3/0679; G06F 3/064;
(Continued)

(56) References Cited

U.S. PATENT DOCUMENTS

| 5,995,424 A | 11/1999 | Lawrence et al. |
| 2011/0161606 A1 | 6/2011 | Tanaka |

(Continued)

FOREIGN PATENT DOCUMENTS

| CN | 105489249 A | 4/2016 |
| CN | 111025122 A | 4/2020 |

(Continued)

OTHER PUBLICATIONS

Ashok K. Sharma, "Future Memory Directions: Megabytes to Terabytes," in Advanced Semiconductor Memories: Architectures, Designs, and Applications, IEEE, 2003, pp. 549-630, ch7.*

(Continued)

*Primary Examiner* — Pierre Michel Bataille
(74) *Attorney, Agent, or Firm* — Harness, Dickey & Pierce, P.L.C.

(57) ABSTRACT

A memory storage device that performs real-time monitoring is provided. The memory storage device comprises a memory controller, and a status indicating module/circuit, wherein the memory controller is configured to perform a first a second initialization operation, the first and second initialization operations performed in response to turning-on of the memory storage device, to generate a first status parameter regarding a status of the memory storage device in which the first initialization operation is performed, and to generate a second status parameter regarding the status of the memory storage device in which a second initialization operation is performed. The status indicating circuit includes a first transistor configured to operate on the basis of the first status parameter, a first resistor connected to the first transistor, a second transistor configured to operate on the basis of the second status parameter, and a second resistor connected to the second transistor.

20 Claims, 21 Drawing Sheets

(58) Field of Classification Search
CPC ............... G06F 11/1048; G11C 29/12; G11C 29/50008; G11C 7/20; G11C 29/48; G11C 29/44; G11C 29/08; G11C 29/56016; G11C 2029/4402; G11C 2029/5602

See application file for complete search history.

(56) References Cited

U.S. PATENT DOCUMENTS

| | | | | |
|---|---|---|---|---|
| 2015/0153409 | A1* | 6/2015 | Zhu | G01R 31/40 714/733 |
| 2019/0282292 | A1* | 9/2019 | Wiener | A61B 18/1206 |
| 2020/0067502 | A1* | 2/2020 | Hiyama | H03K 17/08122 |
| 2021/0075325 | A1* | 3/2021 | Singh | H02M 1/36 |
| 2022/0208278 | A1* | 6/2022 | Vu | G11C 11/5642 |

FOREIGN PATENT DOCUMENTS

| | | | | |
|---|---|---|---|---|
| CN | 112180242 | A | 1/2021 | |
| JP | 2007-123987 | A | 5/2007 | |
| KR | 2002-0013279 | A | 2/2002 | |
| KR | 2008-0076194 | A | 8/2008 | |
| KR | 2016-0106218 | A | 9/2016 | |
| KR | 10-2018-0089121 | A | 8/2018 | |
| WO | WO-9700518 | A1 * | 1/1997 | ............ G11C 29/70 |

OTHER PUBLICATIONS

B. M. Mauck, V. Ravichandran and U. A. Mughal, "A design for test technique for parametric analysis of SRAM: on-die low yield analysis," 2004 International Conferce on Test, Charlotte, NC, USA, 2004, pp. 105-113.*

T. Brożek and D. Ciplickas, "Design and Measurement Requirements for Short Flow Test Arrays to Characterize Emerging Memories," in IEEE Journal of the Electron Devices Society, vol. 7, pp. 1248-1257, 2019.*

European Search Report dated Nov. 14, 2022 issued in European Patent Application No. 22181361.1-1211.

* cited by examiner

MEMORY STORAGE DEVICE, AN OPERATION METHOD OF THE MEMORY STORAGE DEVICE, TEST METHOD AND ELECTRONIC DEVICE

This application claims the benefit of Korean Patent Application No. 10-2021-0107788, filed on Aug. 17, 2021, in the Korean Intellectual Property Office, the disclosure of which is incorporated herein in its entirety by reference.

BACKGROUND

Example embodiments relate to a memory storage device, an operation method of the memory storage device, a test method, and/or an electronic device.

Semiconductor memory devices include volatile memory devices and non-volatile memory devices. While read and write speeds of the volatile memory devices are high, the volatile memory devices may lose the stored contents when a power supply is turned off. In contrast, since the non-volatile memory devices retain the stored contents even when the power supply is turned off, the non-volatile memory devices are used to store the contents to be retained regardless of the presence or absence of the power supply.

For example, the volatile memory devices include one or more of a static RAM (SRAM), a dynamic RAM (DRAM), a synchronous DRAM (SDRAM), and the like. The non-volatile memory devices retain the stored contents even when the power supply is turned off. For example, the non-volatile memory devices include one or more of a read only memory (ROM), a programmable ROM (PROM), an electrically programmable ROM (EPROM), an electrically erasable and programmable ROM (EEPROM), a flash memory, a phase change RAM (PRAM), a magnetic RAM (MRAM), a resistive RAM (RRAM), a ferroelectric RAM (FRAM), and the like. The flash memory may be classified into a NOR type flash memory and a NAND type flash memory.

An initialization operation may be performed after the power supply is turned on the volatile memory device. When manufacturers use the volatile memory device by attaching the volatile memory device to a product, it is necessary/desirable to check the condition of the volatile memory device and perform debugging thereof. At this time, there is a need or desire for a real-time monitoring method for the volatile memory device in which the initialization operation has been performed.

SUMMARY

Some example embodiments provide a memory storage device that performs real-time monitoring.

Alternatively or additionally, some example embodiments provide a method of operating a memory storage device that performs real-time monitoring.

Alternatively or additionally, some example embodiments provide a test method for performing real-time monitoring.

Alternatively or additionally, some example embodiments provide an electronic device that performs real-time monitoring.

However, example embodiments are not restricted to the one set forth herein, and other aspects of inventive concepts will become more apparent to one of ordinary skill in the art to which the present invention pertains by referencing the detailed description of inventive concepts given below.

According to some example embodiments, there is provided a memory storage device comprising a memory controller, and a status indicating module or circuit, wherein the memory controller is configured to perform a first initialization operation and a second initialization operation that are in response to turning-on of the memory storage device, to generate a first status parameter regarding a status of the memory storage device in which the first initialization operation is performed, and to generate a second status parameter regarding the status of the memory storage device in which a second initialization operation is performed. The status indicating circuit includes a first transistor which operates on the basis of the first status parameter, a first resistor connected to the first transistor, a second transistor which operates on the basis of the second status parameter, and a second resistor connected to the second transistor According to some example embodiments, there is provided an operation method of a memory storage device including a status indicating module or circuit, the operation method comprising performing a first initialization operation on the memory storage device, toggling a first status parameter at a first time, on the basis of a first status of the memory storage device in which the first initialization operation is performed, performing a second initialization operation on the memory storage device, toggling a second status parameter at a second time following the first time, on the basis of a second status of the memory storage device in which the second initialization operation is performed, providing the first status parameter and the second status parameter to the status indicating module, changing or switching a first resistor to a second resistor on the basis of toggling of the first status parameter, and changing or switching the second resistor to a third resistor on the basis of toggling of the second status parameter, the changing/switching by the status indicating circuit, wherein the first to third resistors are different from each other.

According to some example embodiments, there is provided a test method comprising connecting a memory storage to a main board, connecting a test apparatus to a test pin connected to the memory storage device, performing a plurality of initialization operations and changing/switching a resistance value connected to the test pin on performance results of the plurality of initialization operations, the changing/switching by the memory storage device, and measuring the resistance value and outputting status information of the memory storage device on the basis of the resistance value, the measuring and outputting by the test apparatus According to some example embodiments, there is provided an electronic device comprising an application processor, and a memory storage device connected to the application processor, wherein the memory storage device includes a memory controller and a status indicating circuit, the memory controller is configured to perform a first operation and a second operation, to generate a first status parameter on a status of the memory storage device in which the first operation is performed, and to generate a second status parameter on the status of the memory storage device in which the second operation is performed. The status indicating circuit includes a first transistor configured to operate on the basis of the first status parameter, a first resistor connected to the first transistor, a second transistor configured to operate on the basis of the second status parameter, and a second resistor connected to a second transistor According to some example embodiments, there is provided a memory storage device which includes a memory controller and a status indicating circuit, wherein the memory controller is configured to perform a first initialization operation and a second initialization operation that are in response to turning-on of the memory storage device, to generate a first status parameter regarding a status of the memory storage device in which the first initialization operation is performed, and to generate a second status parameter regarding the status of the memory storage device in which the second initialization operation is performed. The status indicating circuit includes a first transistor configured to operate on the basis of the first status parameter, a second transistor configured to operate on the basis of the second status parameter, a first resistor, a second resistor, and a multiplexer configured to connect one of the first and second transistors to one of the first and second resistors on the basis of multiplexer selection data.

BRIEF DESCRIPTION OF THE DRAWINGS

These and/or other aspects will become apparent and more readily appreciated from the following description of various example embodiments, taken in conjunction with the accompanying drawings in which.

DETAILED DESCRIPTION OF VARIOUS EXAMPLE EMBODIMENTS

Hereinafter, embodiments according to the technical idea of inventive concepts will be described referring to the accompanying drawings.

Figure 1:
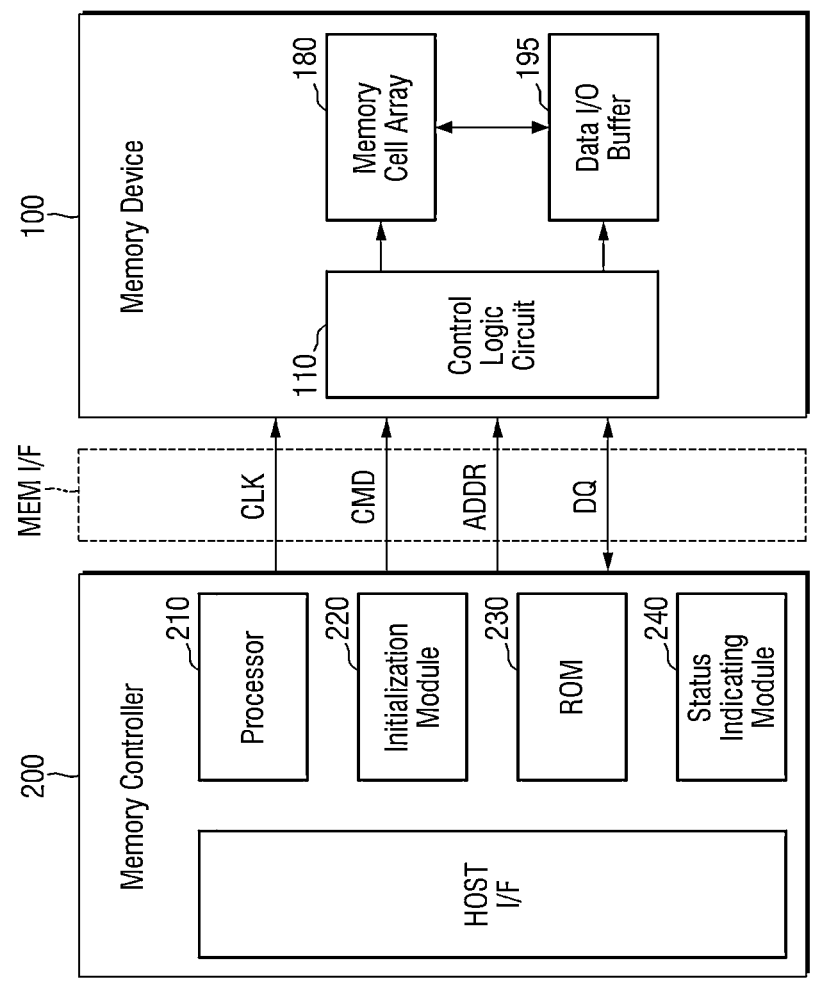
FIG. 1 is a block diagram of a memory storage device according to some example embodiments.

FIG. 1 is a block diagram of a memory storage device according to some example embodiments.

Referring to FIG. 1, a memory storage device 1 may include a memory device 100 and a memory controller 200.

The memory controller 200 may generally control the operation of the memory device 100. For example, the memory controller 200 may control a data exchange between an external host and the memory device 100. For example, the memory controller 200 may control the memory device 100 in response to a request from the host, and may write data and/or read the data accordingly. In some example embodiments, the memory controller 200 may be or may include a processor such as a central processing unit (CPU); however, example embodiments are not limited thereto.

The memory controller 200 and the memory device 100 may communicate with each other through a memory interface MEM I/F. Further, the memory controller 200 and the external host may communicate with each other through a host interface HOST I/F. For example, the memory controller 200 may mediate a signal between the memory device 100 and the host. The memory controller 200 may control the operation of the memory device 100 by applying a command CMD for controlling the memory device 100. Here, the memory device 100 may include dynamic memory cells. For example, the memory device 100 may include one or more of a dynamic random access memory (DRAM), a double data rate 4 (DDR4) synchronous DRAM (SDRAM), a low power DDR4 (LPDR4) SDRAM, an LPDDR5 SDRAM, or the like. However, the example according to of inventive concepts are not limited thereto, and the memory device 100 may alternatively or additionally include a non-volatile memory device.

The memory controller 200 may transmit a clock signal CLK, a command CMD, an address ADDR, or the like to the memory device 100. The memory controller 200 may provide the data DQ to the memory device 100 and may receive the data DQ from the memory device 100. The memory device 100 may include a memory cell array 180 in which data DQ is stored, a control logic circuit 110, a data I/O buffer 195, and the like.

In some example embodiments, the memory controller 200 may include a processor 210, an initialization circuit/module 220, a read-only memory 230, and a status indicating circuit/module 240.

The processor 210 may generally control the operation of the memory controller 200. For example, the processor 210 may process and output the data received from the host or the memory device 100. Further, the processor 210 may read data from the read-only memory 230 and execute the program when the memory storage device 1 is powered on.

The initialization module 220 may perform the initialization operation on the memory storage device 1. For example, when the memory storage device 1 is powered on, the initialization module 220 may perform specific, such as necessary and/or desirable operations before operating the memory storage device 1. Alternatively or additionally, at least some functions of the initialization module 220 may be replaced by or performed by the processor 210. The initialization module 220 may read data from the read-only memory 230 and may execute a program. For example, the initialization module 220 may perform the initialization operation in response to the power-on of the memory storage device 1. The read-only memory 230 corresponds to or may include a non-volatile memory and may provide the stored data to the configurations of the memory controller 200. Here, the data stored in the read-only memory 230 may correspond to the data generated and stored at the time of fabricating the memory controller 200. The initialization module 220 may perform the initialization operation, using the data that is output from the read-only memory 230. For example, the initialization operation may include one or more of a memory storage device reset operation, an impedance calibration operation, a mode register setting value write operation, a training operation, a DCM/DCA calibration operation, a write leveling operation, a read calibration operation, a write calibration operation, and the like. However, example embodiments of inventive concepts are not limited thereto, and the initialization operation may include more diverse types.

The status indicating module 240 may display and/or store and/or indicate the overall status of the memory storage device 1. For example, the status indicating module 240 may output a signal to the status of the memory storage device 1 in which the initialization operation is performed by the initialization module 220. An external device may monitor the signal that is output from the status indicating module 240. The status indicating module 240 may receive the signal from the initialization module 220, and may output a status signal to the memory storage device 1 on the basis of the received signal. For example, the initialization module 220 may indicate the status of the memory storage device 1 in real time. In particular, the initialization module 220 may indicate the status of the memory storage device 1 of a result of performing the initialization operation. A more detailed description thereof will be given later.

Figure 2:
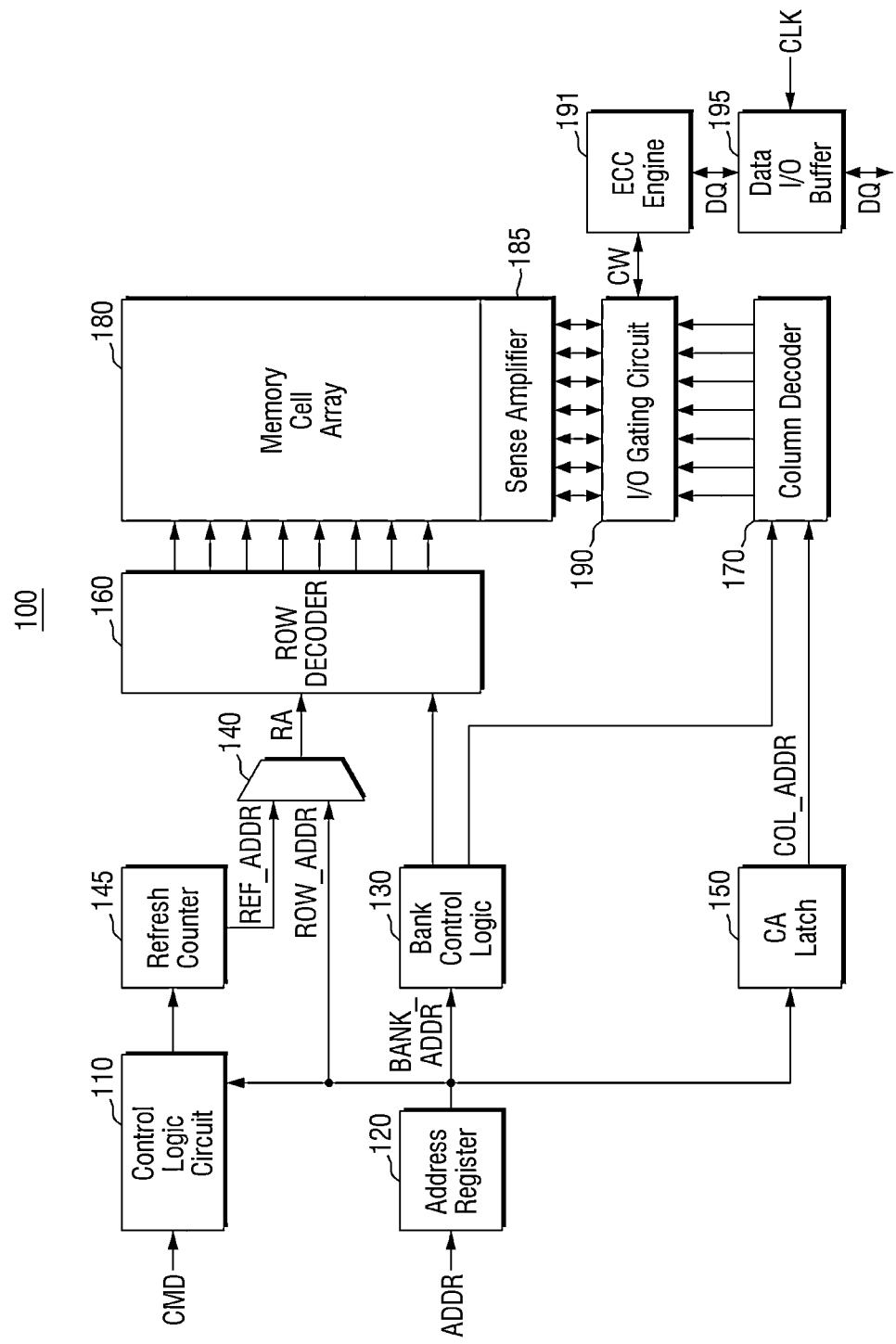
FIG. 2 is a block diagram of the memory device of FIG. 1.

FIG. 2 is a block diagram of the memory device of FIG. 1.

Referring to FIG. 2, the memory device 100 includes a control logic circuit 110, an address register 120, a bank control logic circuit 130, a row address multiplexer 140, a refresh counter 145, a column address latch 150, a row decoder 160, a column decoder 170, a memory cell array 180, a sense amplifier 185, an I/O gating circuit 190, an ECC engine 191, a data I/O buffer 195, and the like.

The memory cell array 180 may include a plurality of bank arrays. The row decoder 160 may be connected to the plurality of bank arrays. The column decoder 170 may be connected to the plurality of bank arrays. The sense amplifier 185 may be connected to each of the plurality of bank arrays. The memory cell array 180 may include a plurality of word lines, a plurality of bit lines, and a plurality of memory cells arranged at intersection points between the word lines and the bit lines.

The address register 120 may be provided with the address ADDR from the memory controller 200. The address ADDR may include a bank address BANK_ADDR, a row address ROW_ADDR, a column address COL_ADDR, and the like. The address register 120 may provide the bank address BANK_ADDR to the bank control logic circuit 130. The address register 120 may provide the row address ROW_ADDR to the row address multiplexer 140. The address register 120 may provide the column address COL_ADDR to the column address latch 150.

The bank control logic circuit 130 may generate a bank control signal in response to the bank address BANK_ADDR. The bank row decoder 160 may be activated in response to the bank control signal. Further, the column decoder 170 may be activated in response to the bank control signal corresponding to the bank address BANK_ADDR.

The row address multiplexer 140 may receive the row address ROW_ADDR from the address register 120, and may receive the refresh row address REF_ADDR from the refresh counter 145. The row address multiplexer 140 may select either the row address ROW_ADDR or the refresh row address REF_ADDR and may output the selected address to the row address RA. The row address RA may be transmitted to the row decoder 160.

The refresh counter 145 may sequentially output the refresh row address REF_ADDR according to the control of the control logic circuit 110.

The row decoder 160 activated by the bank control logic circuit 130 may decode the row address RA that is output from the row address multiplexer 140 and may activate the word line corresponding to the row address RA. For example, the row decoder 160 may apply a word line driving voltage to the word line corresponding to the row address RA.

The column address latch 150 may receive the column address COL_ADDR from the address register 120 and temporarily store the received column address COL_ADDR. The column address latch 150 may gradually increase the column address COL_ADDR received in a burst mode. The column address latch 150 may provide the column decoder 170 with the temporarily stored column address COL_ADDR and/or the gradually increased column address COL_ADDR.

Among the column decoders 170, the column decoder 170 activated by the bank control logic circuit 130 may activate the sense amplifier 185 corresponding to the bank address BANK_ADDR and the column address COL_ADDR through the corresponding I/O gating circuit 190.

The I/O gating circuit 190 may include a circuit for gating the I/O data, an input data mask logic, read data latches for storing data that is output from the memory cell array 180, and write drivers for writing data to the memory cell array 180.

A code word CW that is read from the bank array of the memory cell array 180 may be sensed by the sense amplifier 185 corresponding to the bank array. Further, the code word CW may be stored in the read data latch. The code word CW stored in the read data latch may perform ECC decoding by the ECC engine 191, and the data DQ subjected to the ECC decoding may be provided to the memory controller 200 through the data I/O buffer 195.

The data I/O buffer 195 may provide the data DQ to the ECC engine 191 on the basis of the clock signal CLK in the write operation. The data I/O buffer 195 may provide the memory controller 200 with the data DQ provided from the ECC engine 191 on the basis of the clock signal CLK in the read operation.

Hereinafter, the status indicating module 240 according to inventive concepts will be described referring to FIGS. 3 to 9.

Figure 3:
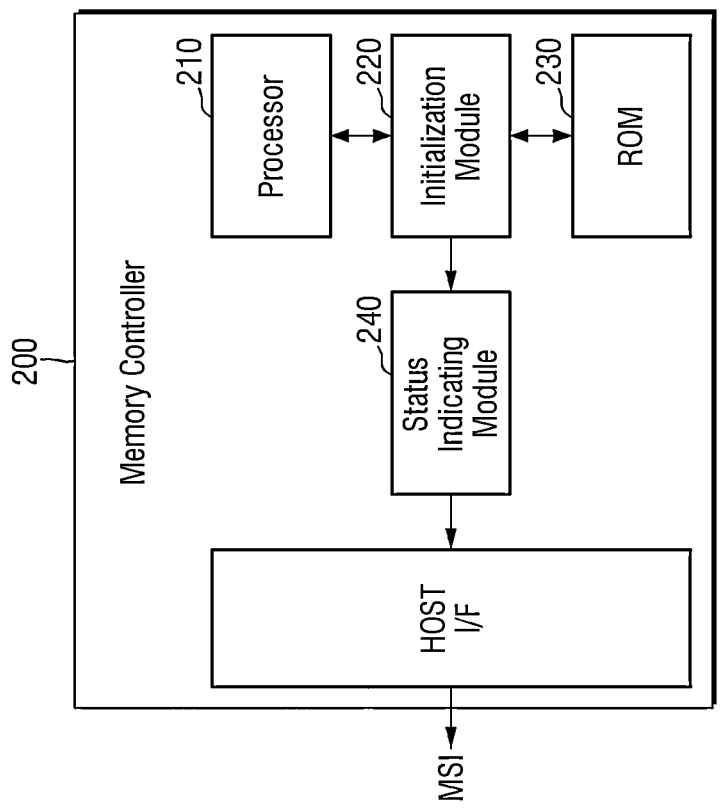
FIG. 3 is a block diagram of a memory controller according to some example embodiments.
Figure 4:
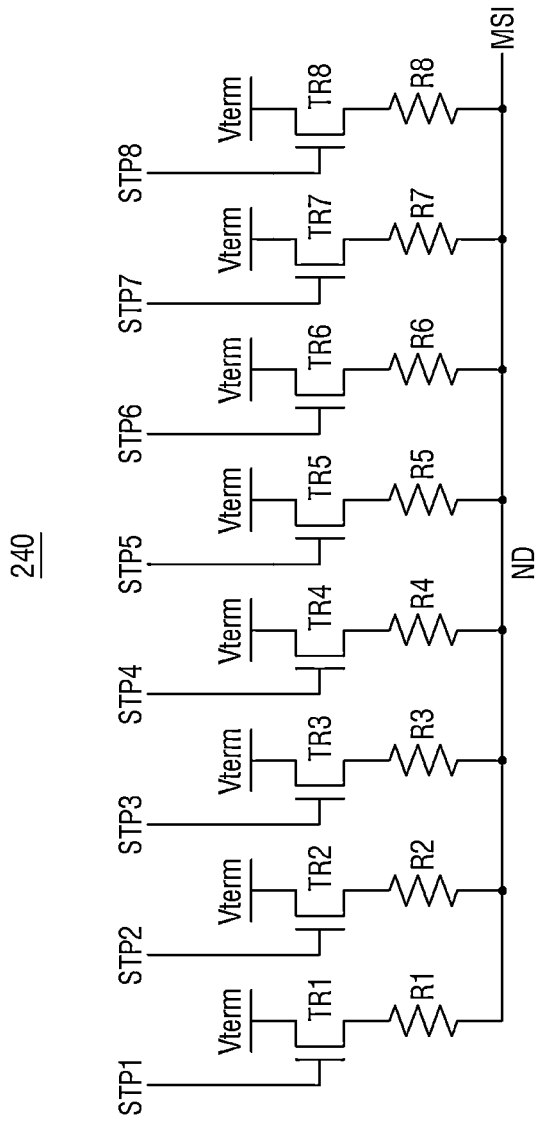
FIG. 4 is a diagram for explaining the status indicating module of FIG. 3.

FIG. 3 is a block diagram of a memory controller according to some example embodiments. FIG. 4 is a diagram for explaining the status indicating module of FIG. 3.

Referring to FIG. 3, the memory controller 200 may include a host interface (HOST I/F), a processor 210, an initialization module 220, a read-only memory 230, and a status indicating module 240. The initialization module 220 may communicate with the processor 210 and the read-only memory 230. The initialization module 220 may receive data from the read-only memory 230, and may perform the initialization operation on the memory storage device 1, using the received data. For example, the initialization module 220 may perform the initialization operation in response to the power-on or turn-on operation of the memory storage device 1. The initialization module 220 may sequentially perform a plurality of initialization operations, using data. However, example embodiments are not limited thereto, and the initialization module 220 may perform a plurality of initialization operations in any order. Furthermore, although FIG. 3 illustrates some one-way connections between various components, this is for illustrative purposes only and example embodiments are not limited thereto. For example, any individual component in FIG. 3 may engage in one-way or two-way communication with any other component in FIG. 3.

The status indicating module 240 may receive the signal from the initialization module 220. The status indicating module 240 may indicate the status of the memory storage device 1, using a signal including the result in which the initialization module 220 performs the initialization operation. For example, the status indicating module 240 may output the status of the memory storage device 1 in which the initialization operation is performed. The memory status information MSI of the memory storage device 1 that is output by the status indicating module 240 may be output through the post interface HOST I/F. The memory status information MSI may change in real time as the signal transmitted from the initialization module 220 changes.

Referring to FIG. 4, the status indicating module 240 may include a plurality of transistors TR1 to TR8 and a plurality of resistors R1 to R8. Here, a plurality of resistors R1 to R8 may be connected in parallel. Furthermore, although eight transistors and eight resistors are illustrated, example embodiments are not limited thereto, and the number of transistors and/or resistors may be greater than or less than eight. Still further although FIG. 4 illustrates that the transistors are each NMOS transistors, example embodiments are not limited thereto, and one or more of the transistors may be PMOS transistors.

A first source drain of the first transistor TR1 may be connected to a terminal voltage Vterm, and a second source drain may be connected to one end of a first resistor R1. The other end of the first resistor R1 may be connected to a node ND. A gate of the first transistor TR1 may receive the first status parameter STP1. The first transistor TR1 may operate on the basis of the first status parameter STP1. For example, the first transistor TR1 may be turned on, on the basis of the toggling of the first status parameter STP1.

The first status parameter STP1 may correspond to the signal transmitted from the initialization module 220. The initialization module 220 may perform the first initialization operation in response to the power-on of the memory storage device 1. When the status of the memory storage device 1 that has performed the first initialization operation is normal, the initialization module 220 may toggle the first status parameter STP1. For example, the initialization module 220 may convert the logic value of the first status parameter STP1 from "0" to "1". If the status of the memory storage device 1 that has performed the first initialization operation is not normal, the initialization module 220 may not toggle the first status parameter STP1. For example, the value of the first status parameter STP1 that is output from the initialization module 220 may be changed, depending on the status of the memory storage device 1 that has performed the first initialization operation. If the first status parameter STP1 is not toggled, the first transistor TR1 may be turned off, and a resistance value of the first resistor R1 in series with the first transistor TR1 that is monitored from the node ND may be large, e.g., infinite. If the first status parameter STP1 is toggled, the first transistor TR1 may be turned on, and the resistance value of the first resistor R1 monitored from the node ND may correspond to a first resistor value. For example, if the status of the memory storage device 1 that has performed the first initialization operation is normal, the resistance value of the first resistor R1 monitored from the node ND in series with the first transistor TR1 may be the first resistor value. Here, the memory status information MSI that is output from the node ND may include a resistance value of the first resistor R1.

In some example embodiments, the initialization operation of the memory storage device 1 performed by the initialization module 220 may be sequentially performed from the first initialization operation to another initialization operation, e.g., an eighth initialization operation. However, example embodiments are not limited thereto, and the first to eighth initialization operations may be performed in any order. As described below, for clarity it is assumed that the first to eighth initialization operations are sequentially performed.

Second to eighth transistors TR2 to TR8 may be arranged in parallel with the first transistor TR1. Further, the second to eighth resistors R2 to R8 may be arranged in parallel with the first resistor R1. The first to eighth resistors R1 to R8 may be commonly connected to the node ND.

Gates of each of the second to eighth transistors TR2 to TR8 may receive the respective second to eighth status parameters STP2 to STP8. The second to eighth transistors TR2 to TR8 may operate on the basis of the second to eighth status parameters STP2 to STP8. Here, the second to eighth status parameters STP2 to STP8 may be toggled sequentially. However, when one of the second to eighth status parameters STP2 to STP8 is not toggled, the remaining status parameters may also not be toggled.

The second to eighth status parameters STP2 to STP8 may indicate the status of the memory storage device 1 in which the second to eighth initialization operations are performed. For example, when the status of the memory storage device 1 in which the second initialization operation is performed is normal, the second status parameter STP2 may be toggled, and when the status of the memory storage device 1 in which the second initialization operation is performed is not normal, the second status parameter STP2 may not be toggled.

The first source/drain of each of the second to eighth transistors TR2 to TR8 may be connected to a terminal voltage Vterm. The second source/drain of each of the second to eighth transistors TR2 to TR8 may be connected to one end of each of the second to eighth resistors R2 to R8. The other ends of the second to eighth resistors R2 to R8 may be connected to the node ND.

Since a part of the second to eighth transistors TR2 to TR8 is turned on, the resistance value monitored between the terminal voltage Vterm and the node ND may include resistance values of the second to eighth resistors R2 to R8. For example, when the first and second transistors TR1 and TR2 are turned on, the resistance values monitored between the terminal voltage Vterm and the node ND may include the resistance values of the first and second resistors R1 and R2. In this case, the first resistor R1 and the second resistor R2 may be connected in parallel. For example, the memory status information MSI that is output from the node ND may correspond to the resistance values of the first resistor R1 and the second resistor R2 connected in parallel. The memory status information MSI may be an analog signal or a digital signal, and may correspond to a resistance between the terminal voltage Vterm. The equivalent resistance between the terminal voltage Vterm and the node ND may decrease depending on the status of the status parameters STP1 to STP8.

In summary, the status indicating module 240 may change the memory status information MSI including the resistance value that is output from the node ND on the basis of the plurality of status parameters STP1 to STP8 received from the initialization module 220. For example, the status indicating module 240 may express the status of the memory storage device 1 subjected to the plurality of initialization operations as the resistance values of the plurality of resistors R1 to R8.

Figure 5:
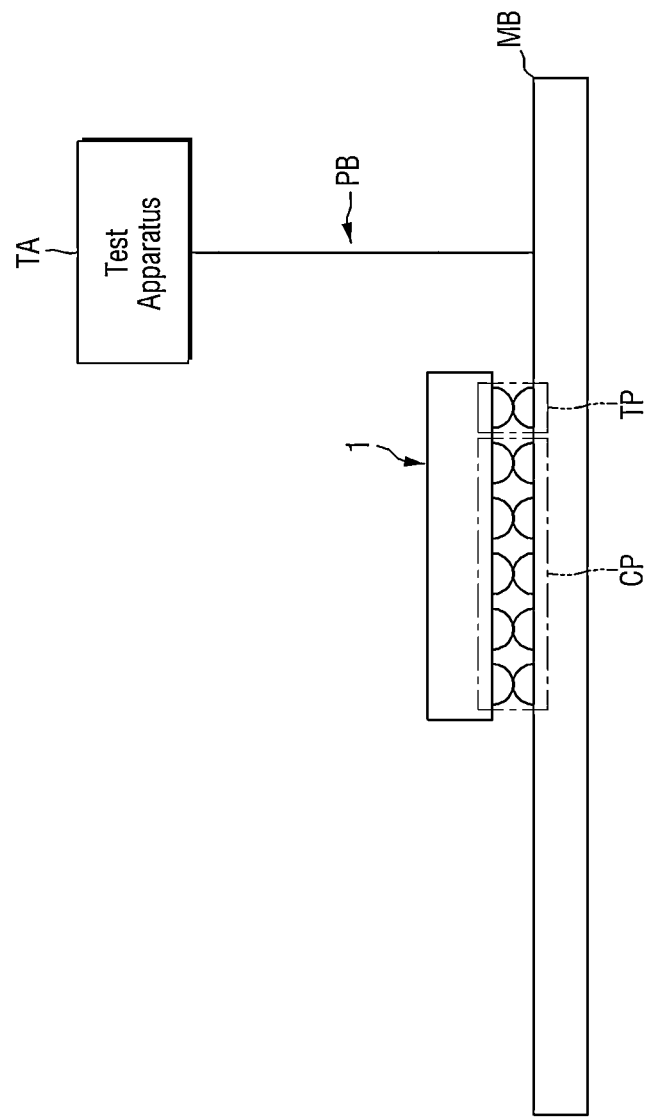
FIG. 5 is a diagram for explaining an example in which a test is performed on a memory storage device using the test apparatus.

FIG. 5 is a diagram for explaining an example in which a test is performed on a memory storage device using the test apparatus.

Referring to FIG. 5, a motherboard/main board MB may include a connecting pin CP and a test pin TP. The memory storage device 1 may also include the counterpart connecting pin CP and the test pin TP. The connecting pin CP and the test pin TP of the main board MB may be connected to correspond to the connecting pin CP and the test pin TP of the memory storage device 1. Here, the memory storage device 1 and the main board MB may be connected by soldering; however, example embodiments are not limited thereto.

The test apparatus TA may be connected to the memory storage device 1 through the test pin TP of the main board MB. A probe PB of the test apparatus TA may be connected to the main board MB. The test apparatus TA may monitor the status of the memory storage device 1 in real time through the probe PB. For example, the signal including the status of the memory storage device 1 transmitted to the test apparatus TA may change with a change in the status of the memory storage device 1. Here, the application processor may not be connected to the main board MB. For example, the memory storage device 1 may not communicate with the application processor, while the real-time monitoring is being performed by the test apparatus TA. However, example embodiments are not limited thereto.

Figure 6:
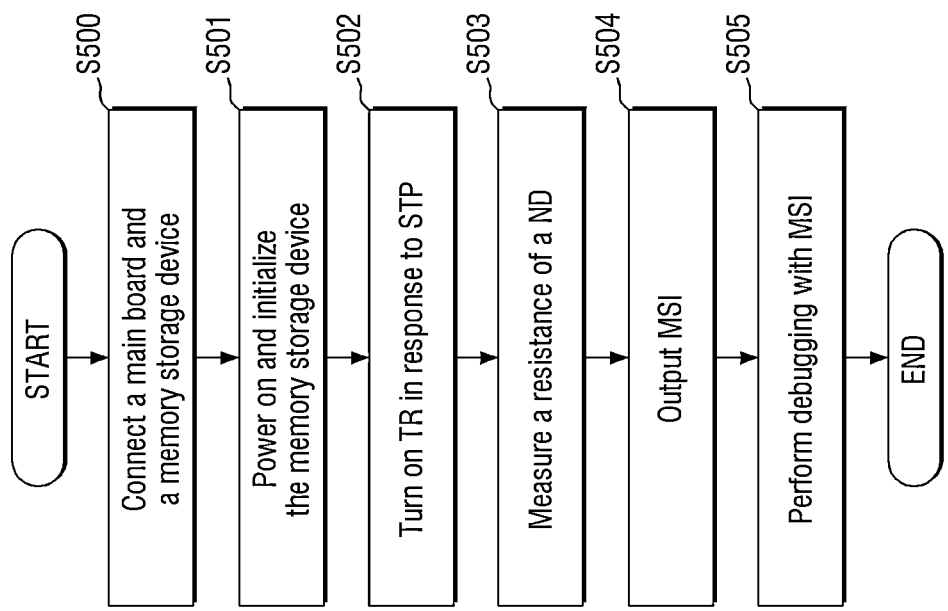
FIG. 6 is a flowchart for explaining the test method of the memory storage device according to some example embodiments.
Figure 7:
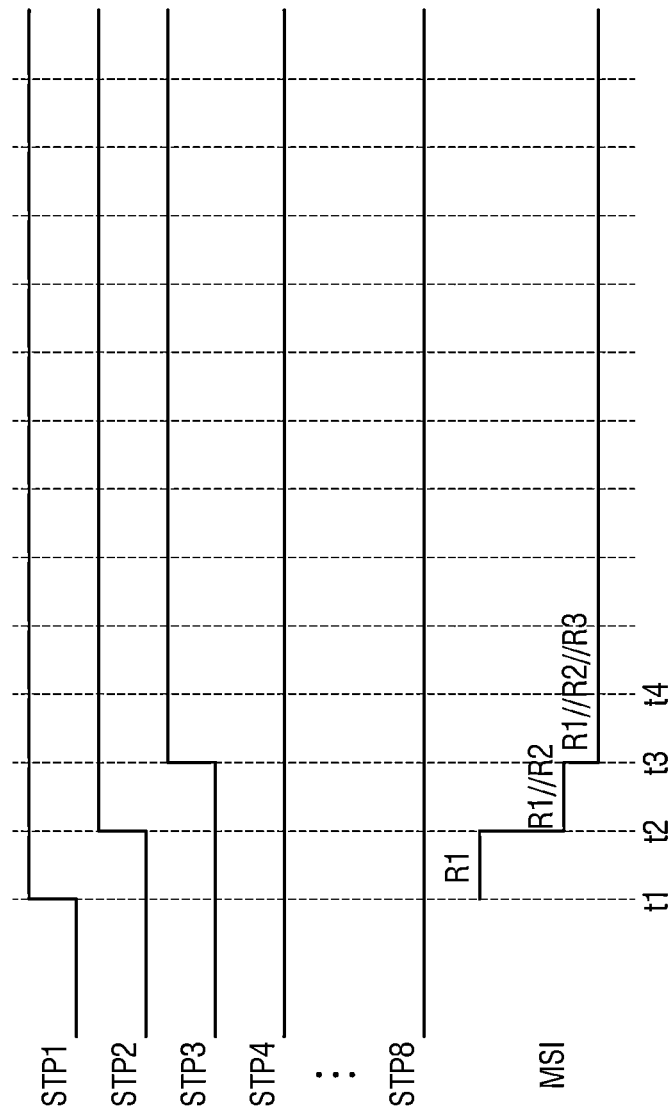
FIG. 7 is a timing diagram of the operation of the memory storage device according to some example embodiments.
Figure 8:
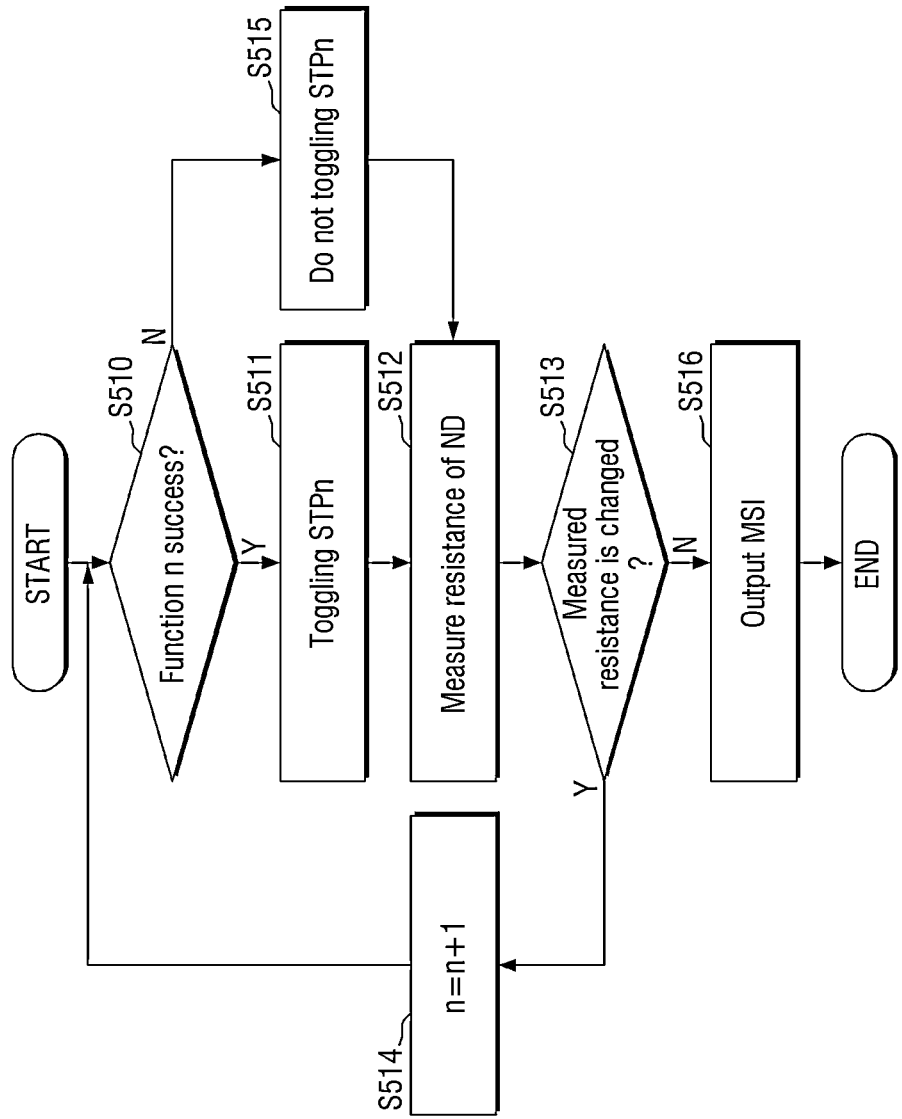
FIG. 8 is a flowchart for explaining the test method of the memory storage device according to some example embodiments.

FIG. 6 is a flowchart for explaining the test method of the memory storage device according to some example embodiments. FIG. 7 is a timing diagram of the operation of the memory storage device according to some example embodiments. FIG. 8 is a flowchart for explaining the test method of the memory storage device according to some example embodiments.

Referring to FIGS. 3 to 6, the main board MB and the memory storage device 1 may be connected (S500). As described referring to FIG. 5, the main board MB and the memory storage device 1 may be connected through the connecting pin CP and the test pin TP.

The memory storage device 1 may be powered on and may perform the initialization operation (S501). The memory storage device 1 may be turned on, using the power supply voltage received from the main board MB. Further, in response to the power-on of the memory storage device 1, the memory storage device 1 may perform a plurality of initialization operations. At this time, the initialization module 220 may output the status of the memory storage device 1 subjected to the plurality of initialization operations as the plurality of status parameters STP1 to STP8. For example, at least one of the plurality of status parameters STP1 to STP8 may be toggled depending on the status of the memory storage device 1.

Zero or more of the plurality of transistors TR1 to TR8 may be turned on in response to the plurality of status parameters STP1 to STP8 (S502). For example, when the first status parameter STP1 is toggled, the first transistor TR1 may be turned on. As the first transistor TR1 is turned on, the first resistor R1 may be connected to the terminal voltage Vterm. However, when the second status parameter STP2 is not toggled, the second transistor TR2 may not be turned on. Accordingly, the second resistor R2 may not be connected to the terminal voltage Vterm.

The test apparatus TA may measure the resistance of the node ND (S503), e.g., the resistance of the node ND with respect to another node such as a ground node. As the plurality of transistors TR1 to TR8 are turned on or off, the resistance values monitored from the node ND may be changed. For example, the resistance values monitored from the node ND when the first and second status parameters STP1 and STP2 are toggled may be the resistance values of the first resistor R1 in parallel with the second resistor R2. For example, the resistance value monitored from the node ND may correspond to the resistance values of the first resistor R1 and the second resistor R2 connected in parallel. Accordingly, the test apparatus TA may check that the first and second initialization operations are performed normally, and may check that the third to eighth initialization operations are not performed normally. However, example embodiments inventive concepts are not limited thereto Subsequently, the status indicating module 240 may output the memory status information MSI (S504). Here, the memory status information MSI may include or correspond to a resistance value monitored from the node ND. Alternatively or additionally, the memory status information MSI may include information about changed resistance values. The test apparatus TA may perform debugging, using the memory status information MSI (S505). For example, the test apparatus TA may grasp a problematic initialization operation through the memory status information MSI and may take measures to normally perform the initialization operation. For example, the test apparatus TA may change the signal to be input to the memory storage device 1 and/or change a passive element connected to the memory storage device 1. Even when communication is not performed through the application processor, efficient debugging may be performed, by monitoring the status of the memory storage device 1 through the test apparatus TA.

Referring to FIGS. 7 and 8, the first to eighth status parameters STP1 to SPT8 and the memory status information MSI may appear. Here, the first to eighth status parameters STP1 to SPT8 may be output from the initialization module 220, and the memory status information MSI may be output from the status indicating module 240.

Before a first time t1, the initialization module 220 may perform the first initialization operation on the memory storage device 1. When the status of the memory storage device 1 that has performed the first initialization operation is normal, the first status parameter STP1 may be toggled. For example, the logic value of the first status parameter STP1 may be converted from "0" to "1" at the first time t1. Accordingly, the first transistor TR1 may be turned on, and the memory status information MSI may correspond to the resistance value of the first resistor R1 in a time interval between the first time t1 and a second time t2. However, in the time interval between the first time t1 and the second time t2, the second to eighth transistors TR2 to TR8 may be turned off.

More specifically, the initialization module 220 may determine whether the memory storage device 1 subjected to a $n^{th}$ initialization operation is normal (S510). When the memory storage device 1 subjected to the $n^{th}$ initialization operation is normal (S510—Y), the initialization module 220 may toggle an $n^{th}$ status parameter STPn (S511). When the memory storage device 1 subjected to the $n^{th}$ initialization operation is not normal (S510—Y), the initialization module 220 may not toggle the $n^{th}$ status parameter STPn (S511). For example, the initialization module 220 may toggle the first status parameter STP1 at the first time t1, but may not toggle the fourth status parameter STP4 at a fourth time t4. However, example embodiments of inventive concepts are not limited thereto Subsequently, the test apparatus TA may measure the resistance of the node ND (S512), e.g., with respect to another node such as a ground node and/or the terminal voltage Vterm. For example, when the first resistor R1 is connected to the terminal voltage Vterm through the first transistor TR1 at the first time t1, the test apparatus TA may measure the resistance value of first resistor R1 connected to the node ND. When the second resistor R2 is connected to the terminal voltage Vterm through the second transistor TR2 at the second time t2, the test apparatus TA may measure the resistance values corresponding to the first resistor R1 and the second resistor R2 connected in parallel to the node ND. Here, the resistance value to be measured may be resistance values of the first resistor R1 and the second resistor R2 connected in parallel. Further, when the third resistor R3 is connected to the terminal voltage Vterm through a third transistor TR3 at the third time t3, the test apparatus TA may measure the resistance values corresponding to the first resistor R1, the second resistor R2 and the third resistor R3 connected to the node ND in parallel. Here, the resistance value to be measured may be resistance values of the first resistor R1, the second resistor R2, and the third resistor R3 that are each connected in parallel. For example, the memory status information MSI may be inversely proportional to the resistance values of the first to third resistors R1 to R3 arranged in parallel. That is, the resistance value included in the memory status information MSI may decrease as time increases.

The status indicating module 240 may determine whether the measured resistance value changes (S513). When the measured resistance value changes (S513—Y), the status indicating module 240 may perform monitoring on an (n+1$^{st}$) initialization operation (S514). For example, when the resistance value included in the memory status information MSI changes at the second time t2, the status indicating module 240 may monitor the third initialization operation. For example, the initialization module 220 may perform the third initialization operation following the second initialization operation, and the status indicating module 240 may monitor the status of the memory storage device 1 in which the third initialization operation is performed.

When the measured resistance value does not change (S513—N), the status indicating module 240 may output the memory status information MSI (S516). For example, when the resistance value included in the memory status information MSI does not change at the fourth time t4, the status indicating module 240 may perform a fifth initialization operation, but the status indicating module 240 may not monitor the status of the memory storage device 1 in which the fifth initialization operation is performed. Alternatively, the status indicating module 240 may output the memory status information MSI including information that the status of the memory storage device 1 due to the fourth initialization operation is not normal. For example, the test apparatus TA may grasp or determine or receive the status of the memory storage device 1 in which a specific initialization operation is performed on the basis of that memory status information MSI. The test apparatus TA may perform debugging, using the memory status information MSI.

However, example embodiments are not limited thereto, and at least one of the fifth to eighth status parameters STP5 to STP8 may be toggled after the fourth time t4. Therefore, the resistance value of the memory status information MSI may also be changed. In summary, the status indicating module 240 may output a plurality of resistances operated by a plurality of status parameters that are output as a result of performing the plurality of initialization operations, and resistance values that change through the plurality of transistors, and the test apparatus TA may monitor the changed resistance value and perform debugging.

Figure 9:
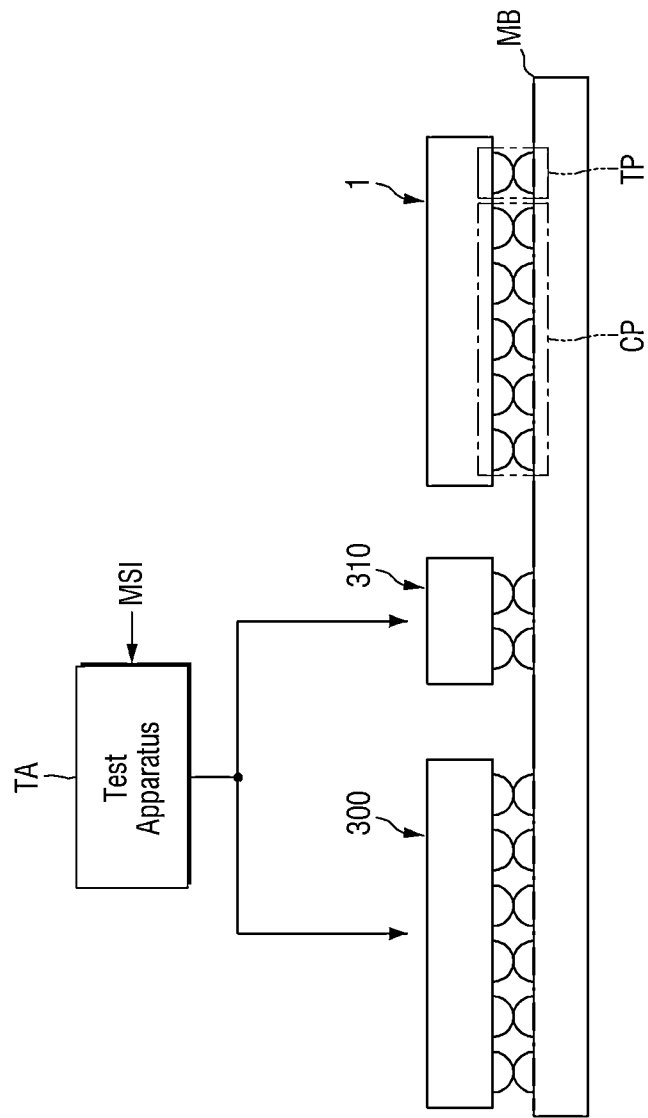
FIG. 9 is a diagram for explaining the test apparatus which performs the debugging according to some example embodiments.

FIG. 9 is a diagram for explaining the test apparatus which performs the debugging according to some example embodiments.

Referring to FIG. 9, the test apparatus TA may perform debugging on a host 300 and a passive element 310 on the basis of the memory status information MSI. For example, if the memory status information MSI indicates that the status of the memory storage device 1 due to the initialization operation after the third initialization operation is abnormal, the test apparatus TA may perform debugging on the host 300 and the passive element 310 on the basis of that information. For example, the setting value to be input to the host 300 and the configuration of the passive element 310 may be changed to modify the initialization operation, except the first to third initialization operations. Here, the host 300 may correspond to the application processor AP, and the passive element 310 may include a resistor, a capacitor, an inductor, and the like. Debugging of the memory storage device 1 may be performed efficiently, by monitoring the status due to the initialization operation of the memory storage device 1 in real time.

Hereinafter, a status indicating module 240a according to some other embodiments will be described referring to FIGS. 10 and 11.

Figure 10:
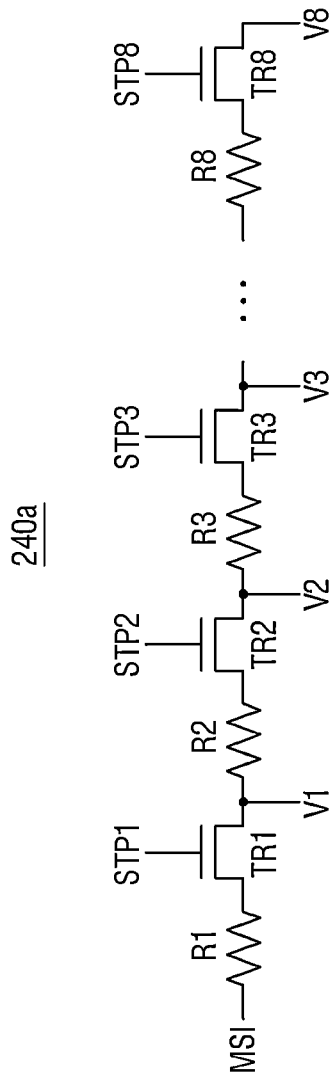
FIG. 10 is a diagram of the status indicating module according to some embodiment.

FIG. 10 is a diagram of the status indicating module according to some example embodiments. FIG. 11 is a timing diagram of the operation of the status indicating module of FIG. 10. For convenience of explanation, repeated parts of contents explained above using FIGS. 1 to 9 will be briefly described or omitted.

Figure 11:
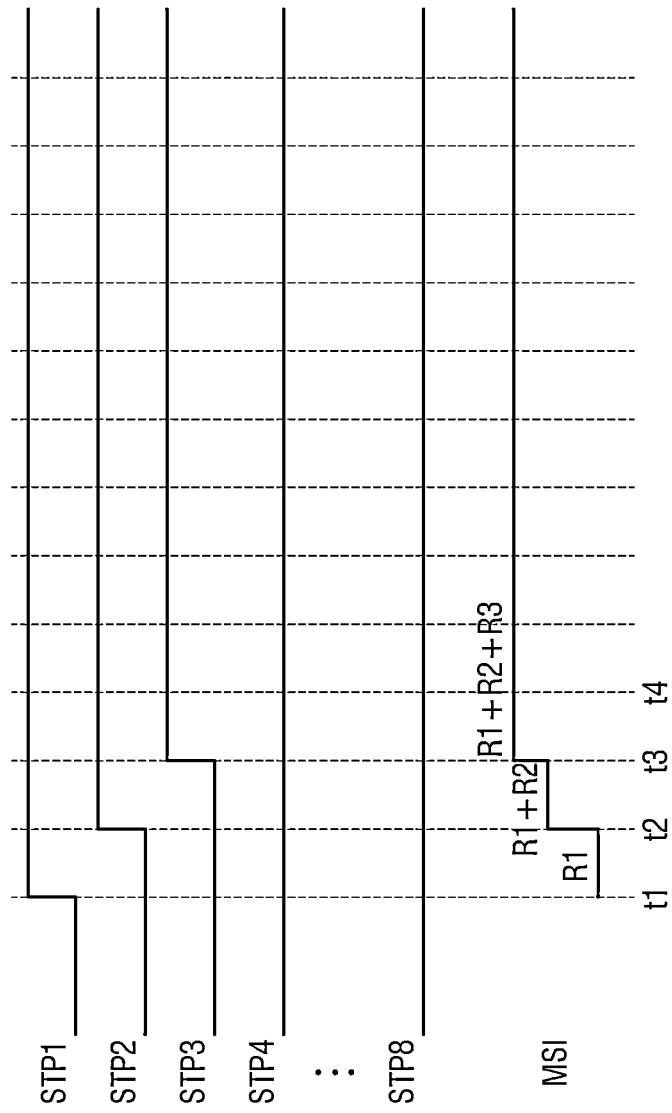
FIG. 11 is a timing diagram of the operation of the status indicating module of FIG. 10.

Referring to FIGS. 10 and 11, a status indicating module 240a may include a plurality of resistors R1 to R8, and a plurality of transistors TR1 to TR8. Here, at least some of the plurality of resistors R1 to R8 and the plurality of transistors TR1 to TR8 may be connected in series. While the plurality of resistors R1 to R8 of the status indicating module 240 described referring to FIGS. 1 to 9 are connected in parallel, the status indicating module 240a may include a plurality of resistors R1 to R8 connected in series. Additionally, although FIG. 10 illustrates that the plurality of transistors TR1 to TR8 are NMOS transistors, example embodiments are not limited thereto, and one or more of the plurality of transistors TR1 to TR8 may be PMOS transistors. Additionally or alternatively, although FIG. 10 illustrates that there are eight transistors, example embodiments are not limited thereto, and there may be more than eight transistors or less than eight transistors.

A source drain of the first transistor TR1 may be connected to the first resistor R1 and the second resistor R2. A first voltage V1 may be applied to the source drain of the first transistor TR1. A first status parameter STP1 may be input to the gate of the first transistor TR1. The first transistor TR1 may be turned on as the first status parameter STP1 is toggled.

The source drain of the second transistor TR2 may be connected to the second resistor R2 and the third resistor R3, and a second voltage V2 may be applied to the source drain of the second transistor TR2. A second status parameter STP2 may be input to the gate of the second transistor TR2. A source drain of the third transistor TR3 may be connected to the third resistor R3 and the fourth resistor R4, and a third voltage V3 may be applied to the source drain of the third transistor TR3. A third status parameter STP3 may be input to the gate of the third transistor TR3. Subsequently, the fourth to eighth resistors R4 to R8 and the fourth to eighth transistors TR4 to TR8 may be connected in series.

At the first time t1, the first status parameter STP1 may be toggled. Accordingly, the first voltage V1 may be applied to the first resistor R1. In this case, the memory status information MSI that is output through the status indicating module 240a may correspond to the resistance value of the first resistor R1. At the second time t2, the second status parameter STP2 may be toggled. Accordingly, the second voltage V2 may be applied to the first resistor R1 and the second resistor R2. In this case, the memory status information MSI that is output through the status indicating module 240a may correspond to the resistance values of the first resistor R1 and the second resistor R2. For example, the memory status information MSI during the time interval between the second time t2 and the third time t3 may be a sum of the resistance value of the first resistor R1 and the resistance value of the second resistor R2.

The third status parameter STP3 may be toggled at the third time t3. Accordingly, the third voltage V3 may be applied to the first resistor R1, the second resistor R2, and the third resistor R3. The memory status information MSI that is output from the status indicating module 240a may correspond to a sum of the resistance value of the first resistor R1, the resistance value of the second resistor R2, and the resistance value of the third resistor R3. After the fourth time t4, the fourth to eighth status parameters STP4 to STP8 may not be toggled, and the memory status information MSI may be maintained as the memory status information MSI during the time interval between the third time t3 and the fourth time t4.

For example, while the resistance value of the memory status information MSI that is output from the status indicating module 240 described referring to FIGS. 1 to 9 decreases with toggling of the status parameters, the resistance value of the memory status information MSI that is output from the status indicating module 240a may increase with toggling of the status parameters. The test apparatus TA may perform debugging by referring to the memory status information MSI.

Hereinafter, a status indicating module 240b according to some example embodiments will be described referring to FIG. 12.

Figure 12:
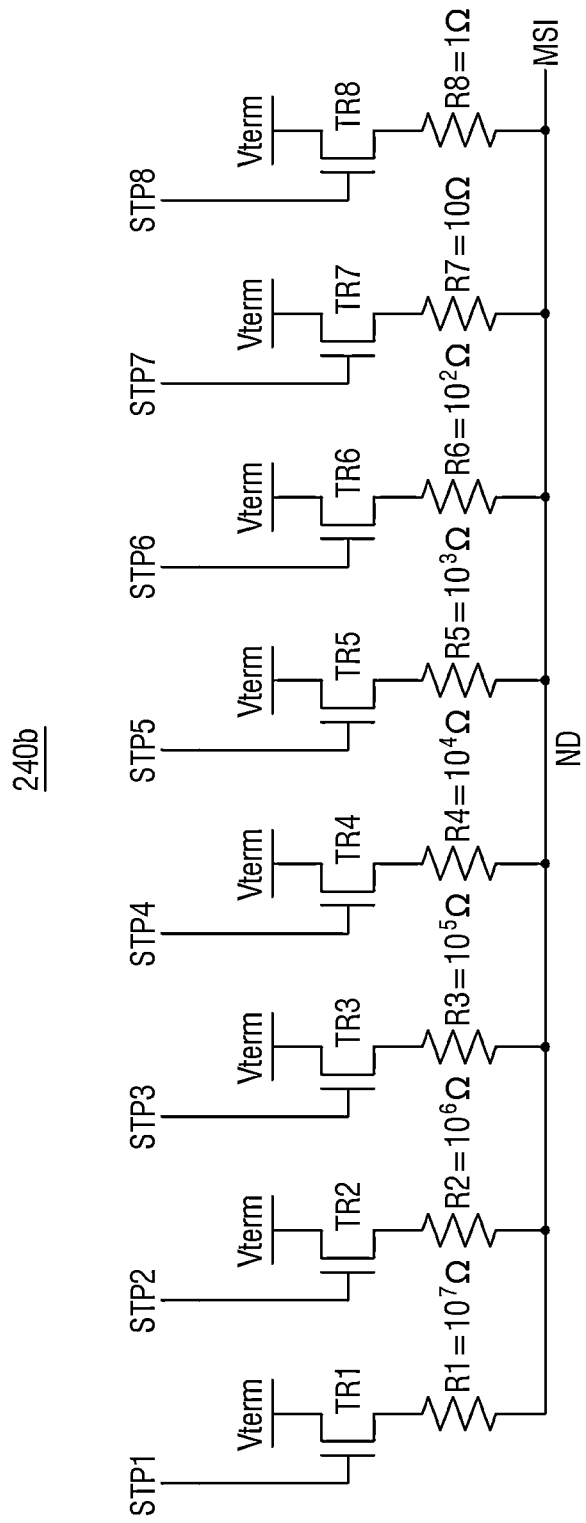
FIG. 12 is a diagram of the status indicating module according to some example embodiments.

FIG. 12 is a diagram of the status indicating module according to some embodiment. For convenience of explanation, repeated parts of contents explained above using FIGS. 1 to 9 will be briefly described or omitted.

Referring to FIG. 12, the status indicating module 240b may include first to eighth resistors R1 to R8. Here, the first to eighth resistors R1 to R8 may have different resistance values from each other, e.g., may have resistances that are orders of magnitude different from one another. For example, the resistance value of the first resistor R1 may be 10 mega-ohms ($10^7 \Omega$), the resistance value of the second resistor R2 may be one mega-ohm ($10^6 \Omega$), the resistance value of the third resistor R3 may be 100 kilo-ohms $10^5 \Omega$, the resistance value of the fourth resistor R4 may be ten kilo-ohms ($10^4 \Omega$), the resistance value of the fifth resistor R5 may be one kilo-ohm ($10^3 \Omega$), the resistance value of the sixth resistor R6 may be one hundred ohms ($10^2 \Omega$), the resistance value of the seventh resistor R7 may be ten ohms ($10 \Omega$), and the resistance value of the eighth resistor R8 may be one ohm ($1 \Omega$).

The first to eighth status parameters STP1 to STP8 may be toggled sequentially, but may be toggled in any order. For example, the third status parameter STP3 may be toggled after the first status parameter STP1 is toggled. The memory status information MSI when the first status parameter STP1 is toggled may correspond to $10^7 \Omega$ which is the resistance value of the first resistor R1. After that, the memory status information MSI when the third status parameter STP3 is toggled may correspond to $10^5 \Omega$, which is the resistance value of the first resistor R1 and the third resistor R3 connected in parallel. For example, by connecting the resistors having different resistance values from each other, it may be possible to determine which initialization operation has an abnormality through the memory status information MSI to be output. However, example embodiments are not limited thereto.

Hereinafter, a status indicating module 240c according to some other embodiments will be described referring to FIGS. 13 to 15.

Figure 13:
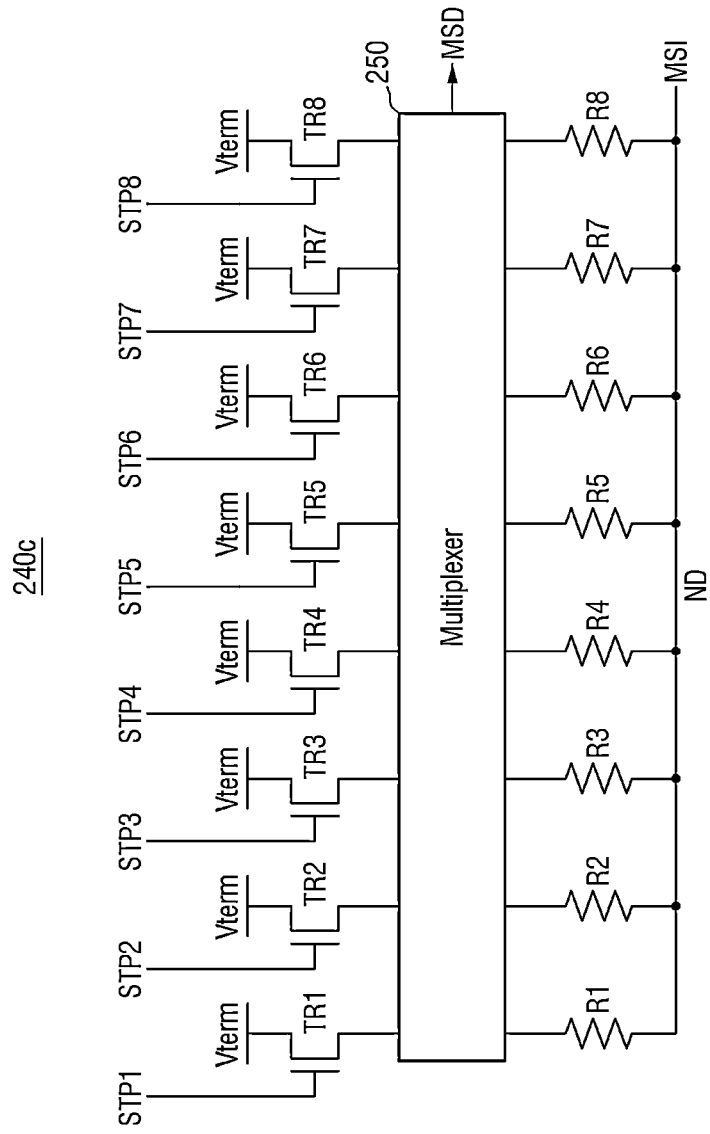
FIG. 13 is a diagram of the status indicating module according to some example embodiments.

FIG. 13 is a diagram of the status indicating module according to some embodiment. FIG. 14 is a diagram of a test apparatus that receives a signal from the status indicating module of FIG. 13. FIG. 15 is a flowchart for explaining a test method of the memory storage device according to FIGS. 13 and 14. For convenience of explanation, repeated parts of contents explained above using FIGS. 1 to 9 will be briefly described or omitted.

Figure 14:
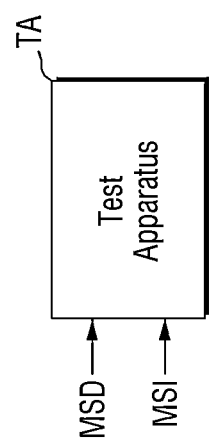
FIG. 14 is a diagram of a test apparatus that receives a signal from the status indicating module of FIG. 13.

Referring to FIGS. 13 and 14, the status indicating module 240c may include a multiplexer 250. Here, the multiplexer 250 may be placed between the plurality of resistors R1 to R8 and the plurality of transistors TR1 to TR8. For example, the multiplexer 250 may connect the plurality of resistors R1 to R8 and the plurality of transistors TR1 to TR8. The multiplexer 250 may selectively connect the plurality of resistors R1 to R8 with the plurality of transistors TR1 to TR8. For example, unlike the example in which the plurality of resistors R1 to R8 match with the plurality of transistors TR1 to TR8 in the status indicating module 240c described referring to FIGS. 1 to 9, the plurality of resistors R1 to R8 and the plurality of transistors TR1 to TR8 of the status indicating module 240c may be selectively connected through the multiplexer 250. The multiplexer 250 may connect the plurality of resistors R1 to R8 and the plurality of transistors TR1 to TR8, using the multiplexer selection data MSD. Further, the multiplexer 250 may output the multiplexer selection data MSD and provide it to the test apparatus TA. The test apparatus TA receives the multiplexer selection data MSD and the memory status information MSI, and may monitor the status of the memory storage device 1, using them.

Figure 15:
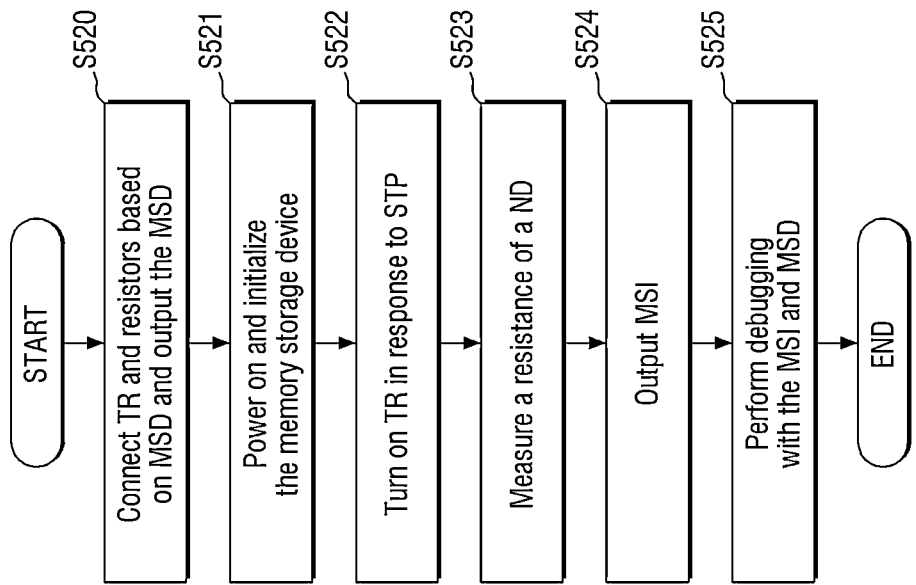
FIG. 15 is a flowchart for explaining a test method of the memory storage device according to FIGS. 13 and 14.

Referring to FIGS. 13 to 15, the multiplexer 250 may connect the resistors and the transistors on the basis of the multiplexer selection data MSD and output the multiplexer selection data MSD (S520). For example, the multiplexer 250 may connect one of the plurality of transistors TR1 to TR8 to one of the plurality of resistors R1 to R8. Further, the multiplexer selection data MSD for the data in which the resistors and the transistors are connected may be provided to the test apparatus TA.

The memory storage device 1 may be powered on and perform the initialization operation (S521). The plurality of transistors TR1 to TR8 may be turned on in response to the plurality of status parameters STP1 to STP8 (S522). Subsequently, the test apparatus TA may measure the resistance of the node ND (S523). The status indicating module 240 may output the memory status information MSI (S524).

The test apparatus TA may perform debugging, using the memory status information MSI and the multiplexer selection data MSD (S525). For example, the connection status between the plurality of resistors R1 to R8 and the plurality of transistors TR1 to TR8 may be monitored, using the multiplexer selection data MSD, and the change of the resistance value may be monitored, using the memory status information MSI. For example, even if the order of the initialization operations of the initialization module 220 is changed or omitted, the test apparatus TA may monitor the memory storage device 1, using the multiplexer selection data MSD. However, example embodiments are not limited thereto Hereinafter, a method of monitoring the memory storage device 1 according to some other embodiments will be described referring to FIGS. 16 and 17.

Figure 16:
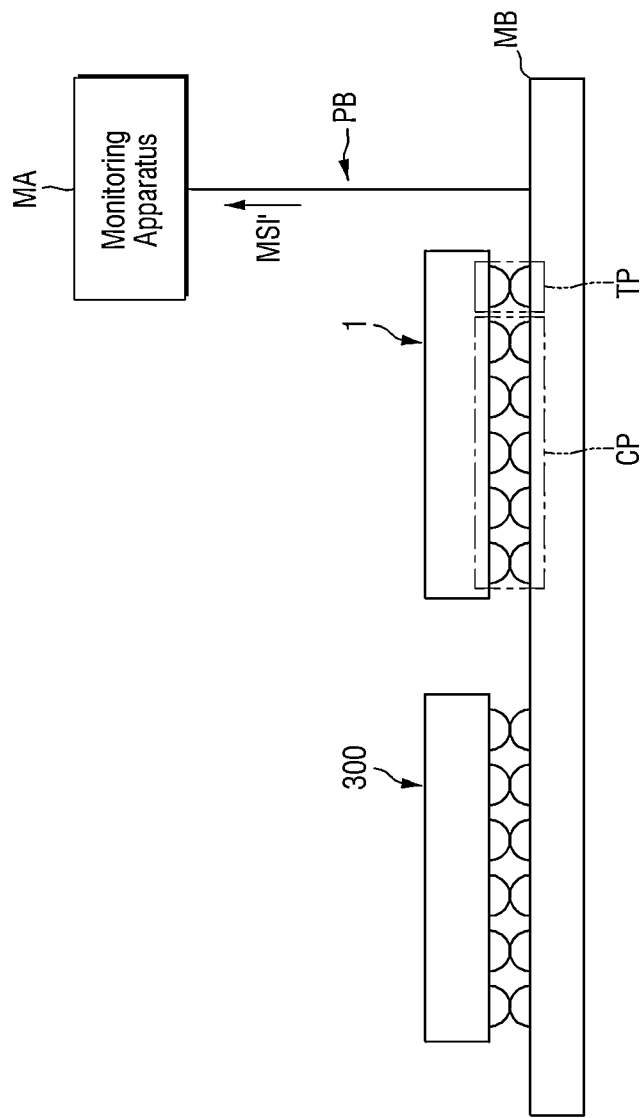
FIGS. 16 and 17 are diagrams for explaining a test apparatus that performs a test on a memory storage device that communicates with the host according to some example embodiments.
Figure 17:
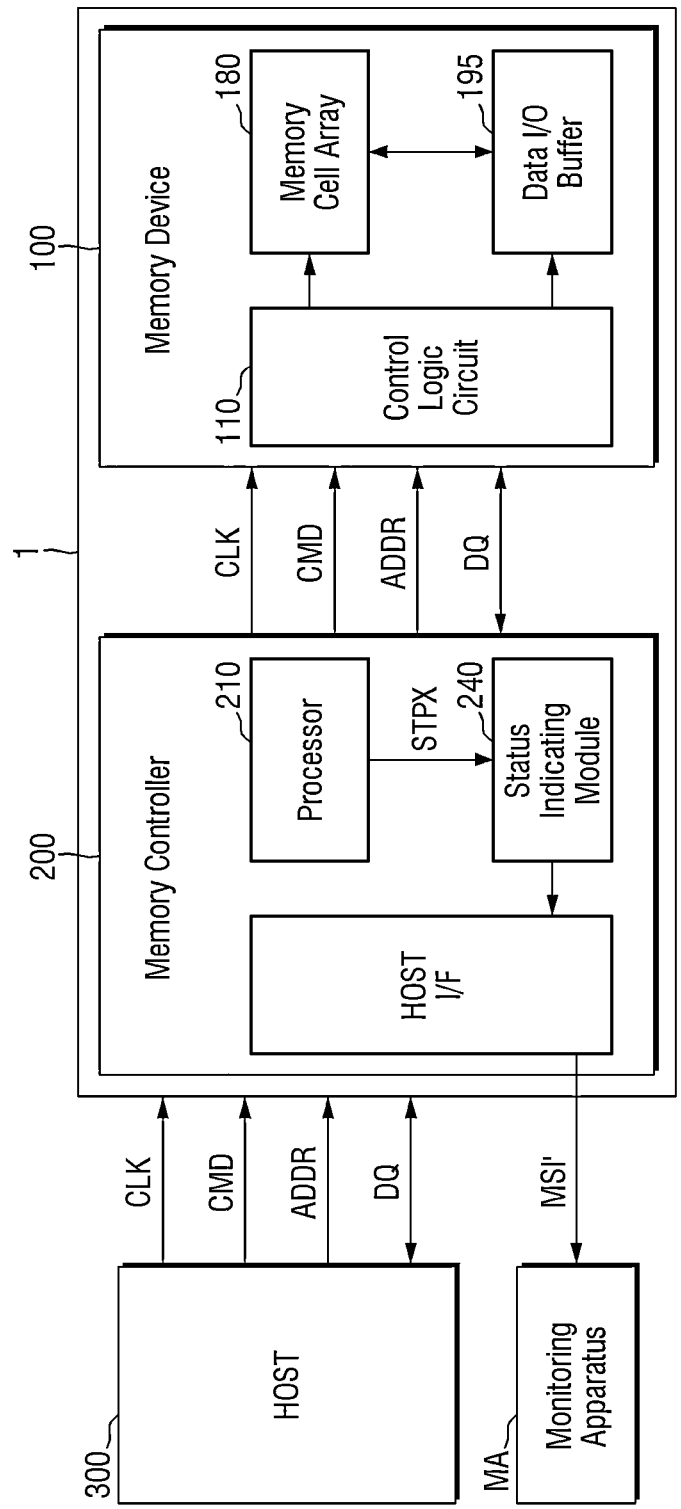

FIGS. 16 and 17 are diagrams for explaining a test apparatus that performs a test on a memory storage device that communicates with the host according to some example embodiments. For convenience of explanation, repeated parts of contents explained above using FIGS. 1 to 9 will be briefly described or omitted.

Referring to FIG. 16, the memory storage device 1 and the host 300 may be mounted on the main board MB. Here, the host 300 may be connected to the memory storage device 1 through the main board MB. The host 300 and the memory storage device 1 may communicate with each other through the main board MB. Further, the monitoring apparatus MA may be connected to the main board MB through the probe PB. Here, the probe PB may be connected to the memory storage device 1 through the test pin TP. The monitoring apparatus MA may receive memory status information MSI' from the memory storage device 1. The monitoring apparatus MA may monitor the status of the memory storage device 1 on the basis of the memory status information MSI'. While the monitoring apparatus MA performs monitoring, the host 300 and the memory storage device 1 may communicate with each other.

Referring to FIG. 17, the host 300 may transmit the clock signal CLK, the command CMD, and the address ADDR to the memory storage device 1. Further, the host 300 may send and receive the data DQ to and from the memory storage device 1. Further, the memory storage device 1 may operate on the basis of the signal received from the host 300. For example, the memory storage device 1 may perform a plurality of operations. The memory controller 200 may perform a plurality of operations, and the processor 210 provides the status indicating module 240 with a status parameter STPX of the status of the memory storage device 1 that has performed the plurality of operations. The status indicating module 240 may change the resistance value measured by the monitoring apparatus MA on the basis of the status parameter STPX.

For example, when the status of the memory storage device 1 in which the first operation is performed is normal, the resistance value of the memory status information MSI' that is output from the status indicating module 240 may change. However, when the status of the memory storage device 1 in which the second operation following the first operation is performed is not normal, the resistance value of the memory status information MSI' that is output from the status indicating module 240 may not change. For example, even when communication between the host 300 and the memory storage device 1 is performed and the memory storage device 1 operates on the basis of the signal from the host 300, the monitoring apparatus MA may monitor the memory storage device 1, using the memory status information MSI'. However, example embodiments are not limited thereto.

Hereinafter, a memory storage device 1a and a memory storage device 1b according to some other embodiments will be described referring to FIGS. 18 and 19.

Figure 18:
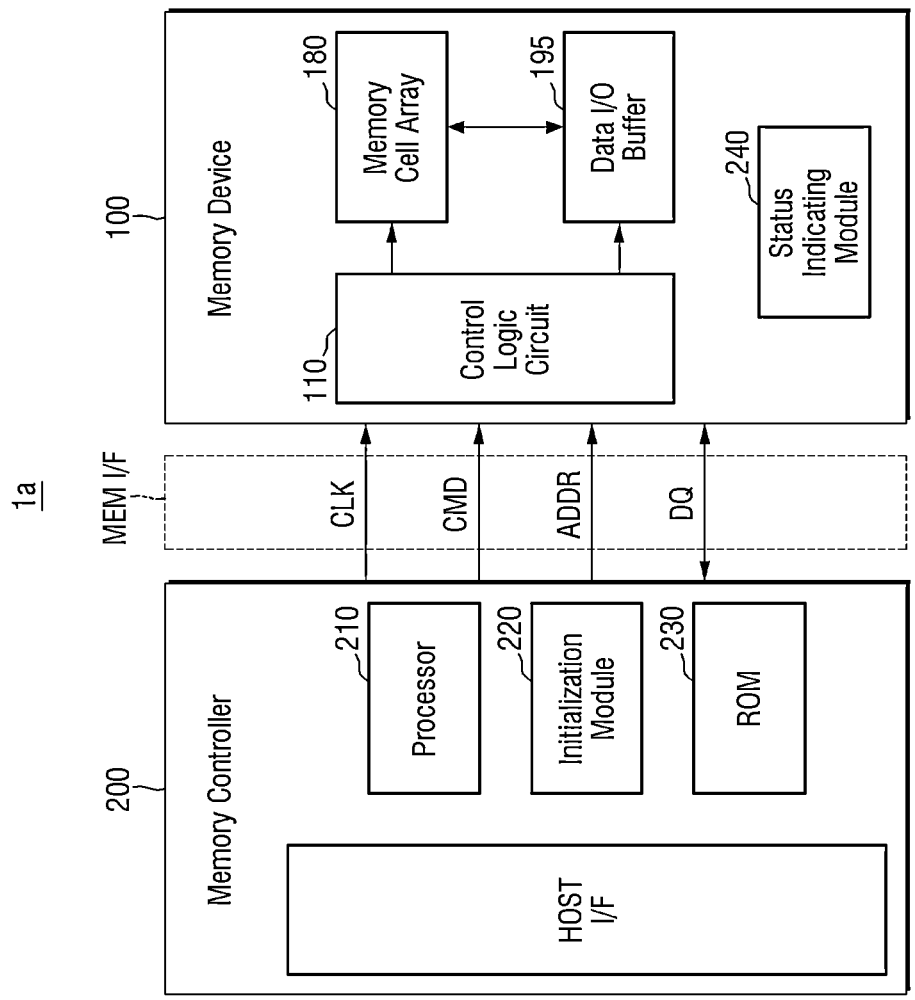
FIG. 18 is a block diagram of the memory storage device according to some example embodiments.

FIG. 18 is a block diagram of the memory storage device according to some example embodiments. FIG. 19 is a block diagram of the memory storage device according to some example embodiments. For convenience of explanation, repeated parts of contents explained above using FIGS. 1 to 9 will be briefly described or omitted.

Referring to FIG. 18, a memory device 100 of a memory storage device 1a may include a status indicating module 240. Unlike the example in which the memory controller 200 of the memory storage device 1 described referring to FIGS. 1 to 9 includes the status indicating module 240, the status indicating module 240 may be placed inside the memory device 100 in the present embodiment. The status indicating module 240 may output information about the status of the memory storage device 1a.

Figure 19:
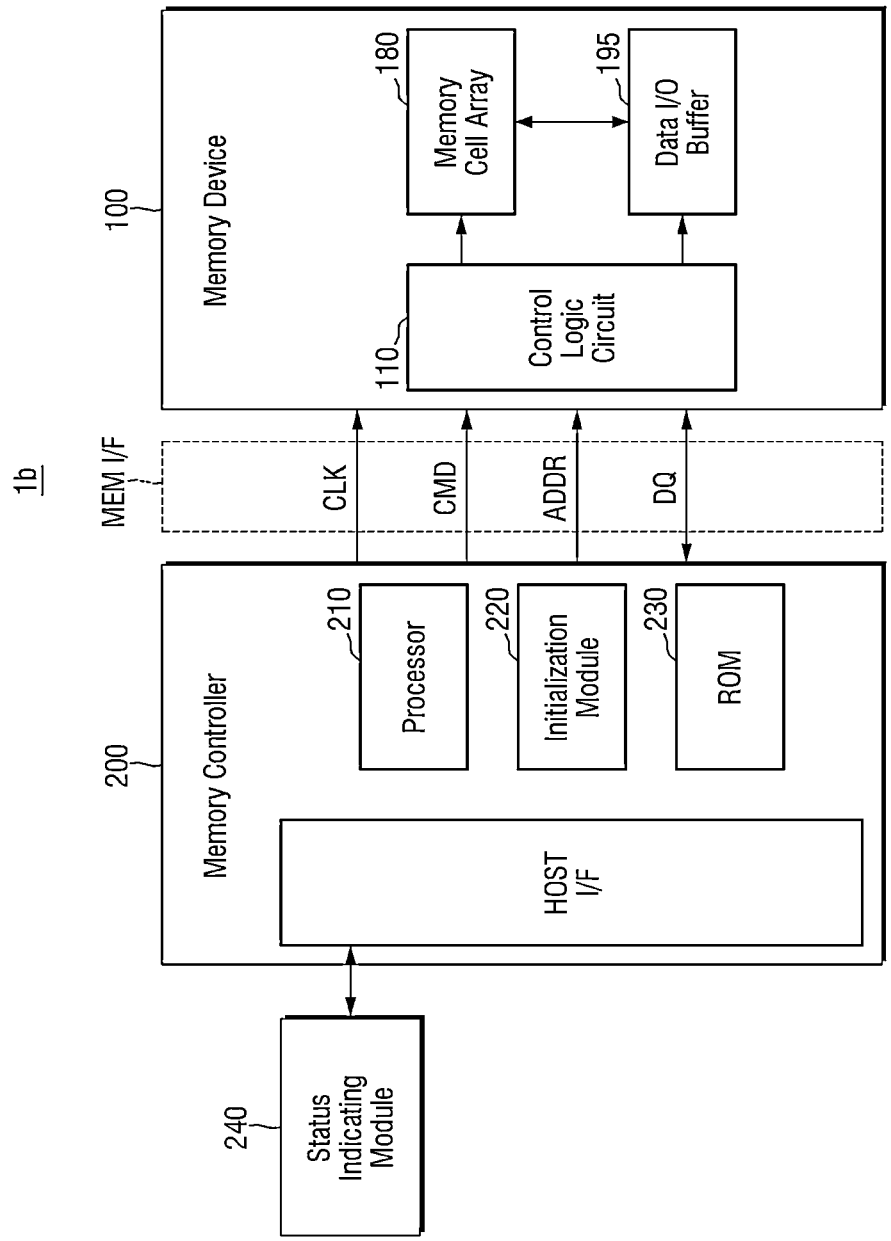
FIG. 19 is a block diagram of the memory storage device according to some example embodiments.

Referring to FIG. 19, a memory storage device 1b may include a memory device 100, a memory controller 200, and a status indicating module 240. Here, the status indicating module 240 may be placed separately from the memory device 100 and the memory controller 200. For example, the status indicating module 240 may be placed outside/external to the memory device 100 and the memory controller 200. The status indicating module 240 may output information about the status of the memory storage device 1b, by receiving and processing the status parameter from the memory controller 200.

Hereinafter, a memory storage device 400 according to some example embodiments will be described referring to FIG. 20.

Figure 20:
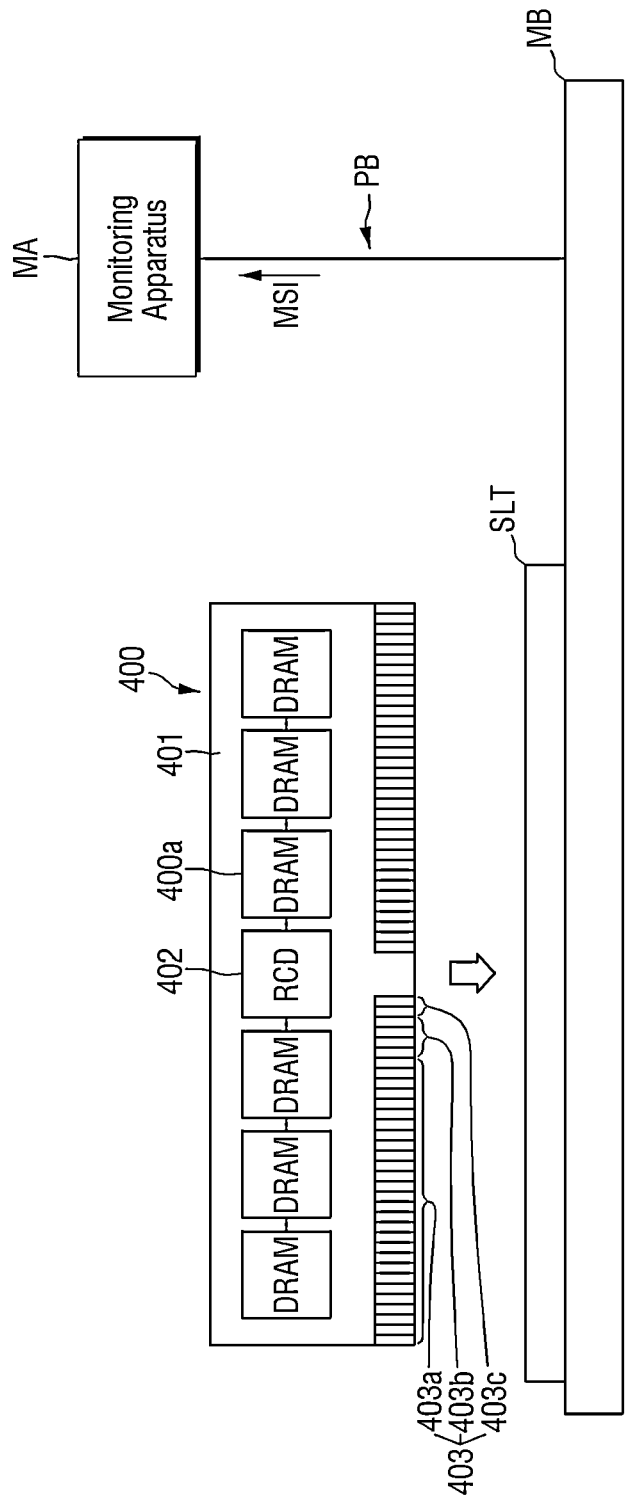
FIG. 20 is a diagram of the memory storage device according to some example embodiments.

FIG. 20 is a diagram of the memory storage device according to some example embodiments. For convenience of explanation, repeated parts of contents explained above using FIGS. 1 to 9 will be briefly described or omitted.

Referring to FIG. 20, the memory storage device 400 may be mounted in a memory slot SLT. Here, the memory slot SLT may be placed on the main board MB. The memory storage device 400 may be connected to the main board MB through the memory slot SLT, and may be connected to the monitoring apparatus MA. The memory slot SLT may be called a memory socket.

The memory storage device 400 may be a dual in-line memory module (DIMM). The memory storage device 400 may include a plurality of memory devices 400a. Here, the plurality of memory devices 400a may be arranged in a row and connected to each other. Here, the memory device 400a may correspond to the memory device 100 described referring to FIGS. 1 to 9.

The memory storage device 400 may include a substrate 401, a register clock driver 402, a plurality of memory devices 400a, and a connecting pin 403. The register clock driver 402, the plurality of memory devices 400a, and the connecting pin 403 may be mounted on the substrate 401. Further, the register clock driver 402, the plurality of memory devices 400a, and the connecting pin 403 may be electrically connected by the connecting devices included in the substrate 401. The substrate 401 may include a plate made of an insulator such as plastic, and connecting devices connected to the register clock driver 402, the plurality of memory devices 400a and the connecting pin 403.

The connecting pin 403 may be placed along the lower part of the substrate 401, and may be placed so that the upper side of the connecting pin 403 is exposed. The connecting pin 403 may include a data pin 403a, a command address pin 403b, and a test pin 403c. The test pin 403c may be connected to the monitoring apparatus MA through the probe PB.

The register clock driver 402 (RCD) may be mounted on the substrate 401. The register clock driver 402 may be connected to the memory device 400a and the connecting pin 403 through wirings on the substrate 401.

The register clock driver 402 may receive the clock signal CLK, the command CMD, the address ADDR, and the like through the command address pin 403b. The register clock driver 402 may provide the clock signal CLK, the command CMD, the address ADDR, and the like to the plurality of memory devices 400a. Here, the memory storage device 400 including the register clock driver 402 may operate on the basis of the RDIMM (registered DIMM). The register clock driver 402 in this embodiment may correspond to the memory controller 200 described referring to FIGS. 1 to 9. For example, the register clock driver 402 may include a status indicating module 240 that monitors the status of the memory storage device 400. The monitoring apparatus MA may receive the memory status information that is output from the status indicating module 240 of the register clock driver 402 through the test pin 403c, and monitor the status of the memory storage device 400.

Hereinafter, a vehicle 700 including an electronic control device 710 and a memory storage device 720 according to some other embodiments will be described referring to FIG. 21.

Figure 21:
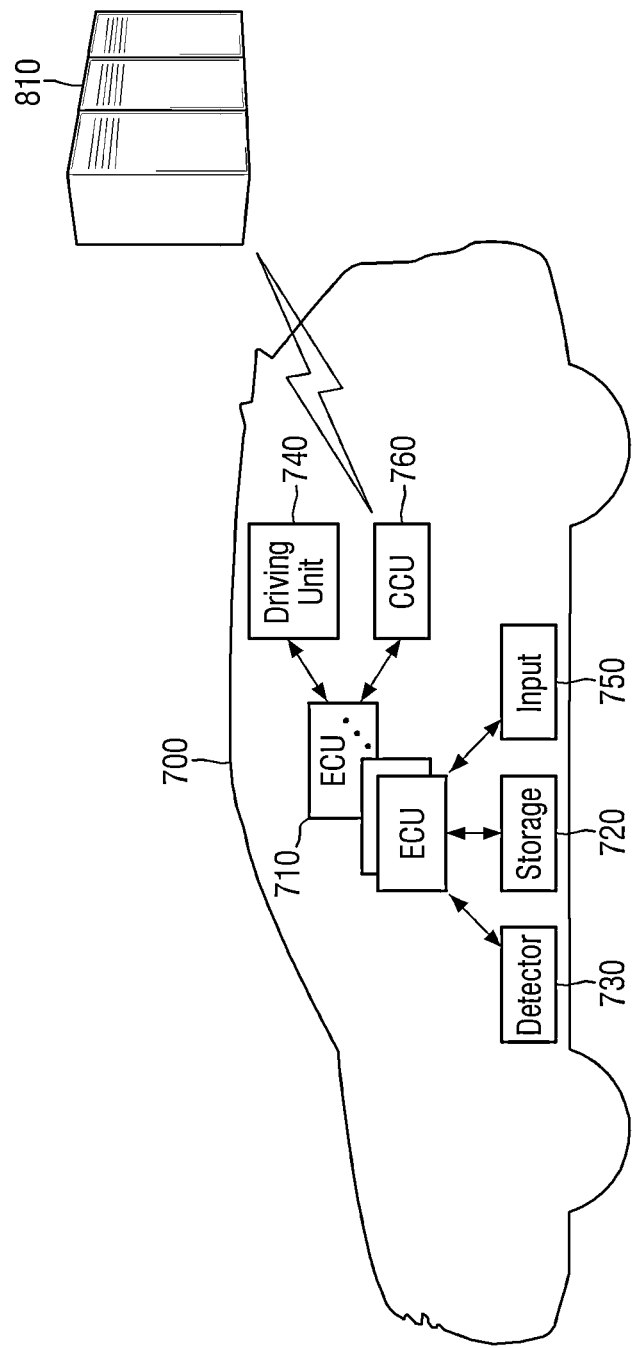
FIG. 21 is a diagram of a vehicle including a memory storage device according to some example embodiments.

FIG. 21 is a diagram of a vehicle including a memory storage device according to some example embodiments. For convenience of explanation, repeated parts of contents explained above using FIGS. 1 to 20 will be briefly described or omitted.

Referring to FIG. 21, the vehicle 700 may include a plurality of electronic control units (ECU) 710 and a memory storage device 720. At this time, the electronic control device 710 may correspond to the host 300 described above, and the memory storage device 1 may correspond to the memory storage device 720. For example, the memory storage device 720 may include the status indicating module 240.

Each or at least some of the electronic control device of the plurality of electronic control devices 710 is electrically, mechanically, and/or communicatively connected to at least one of the plurality of devices provided in the vehicle 700, and may control the operation of at least one device on the basis of any one function execution command.

Here, the plurality of devices may include an acquisition device 730 that acquires information required to perform at least one function, and a driving unit 740 that performs at least one function.

For example, the acquisition device 730 may include various detection units and image acquisition units, and the driving unit 740 may include a fan and a compressor of an air conditioner, a fan of a ventilation device, an engine and a motor of a power unit, a motor of a steering device, a motor and a valve of a braking device, opening and closing devices of a door or a tailgate, and the like.

The plurality of electronic control devices 710 may communicate with the acquisition device 730 and the driving unit 740 using, for example, at least one of an Ethernet, a low voltage differential signaling (LVDS) communication, and a LIN (Local Interconnect Network) communication.

The plurality of electronic control devices 710 determine whether there is a need to or a desire to perform the function on the basis of the information acquired through the acquisition device 730, and when it is determined that there is a need to perform the function, the plurality of electronic control devices 710 controls the operation of the driving unit 740 that performs the function, and may control an amount of operation on the basis of the acquired information. At this time, the plurality of electronic control devices 710 may store the acquired information in the memory storage device 720, or may read and use the information stored in the memory storage device 720.

The plurality of electronic control devices 710 is able to control the operation of the driving unit 740 that performs the function on the basis of the function execution command that is input through the input unit 750, and is also able to control the operation of the driving unit 740 that checks the setting amount corresponding to the information that is input through the input unit 750 and performs the function on the basis of the checked setting amount.

Each electronic control device 710 may control any one function independently, or may control any one function in cooperation with other electronic control devices.

For example, when a distance to an obstacle detected through a distance detection unit is within a reference distance, an electronic control device of a collision prevention device may output a warning sound for a collision with an obstacle through a speaker.

An electronic control device of an autonomous driving control device may receive navigation information, road image information, and distance information to obstacles in cooperation with the electronic control device of the vehicle terminal, the electronic control device of the image acquisition unit, and the electronic control device of the collision prevention device, and control the power device, the braking device, and the steering device using the received information, thereby performing the autonomous driving.

A connectivity control unit (CCU), 760 is electrically, mechanically, and communicatively connected to each of the plurality of electronic control devices 710, and communicates with each of the plurality of electronic control devices 710.

For example, the connectivity control unit 760 is able to directly communicate with a plurality of electronic control devices 710 provided inside the vehicle, is able to communicate with an external server, and is also able to communicate with an external terminal through an interface.

Here, the connectivity control unit 760 may communicate with the plurality of electronic control devices 710, and may communicate with the server 810, using an antenna (not shown) and a RF communication.

Further, the connectivity control unit 760 may communicate with the server 810 by wireless communication. At this time, wireless communication between the connectivity control unit 760 and the server 810 may be performed through various wireless communication methods such as one or more of a GSM (global System for Mobile Communication), a CDMA (Code Division Multiple Access), a WCDMA (Wideband Code Division Multiple Access), a UMTS (universal mobile telecommunications system), a TDMA (Time Division Multiple Access), and an LTE (Long Term Evolution), in addition to a Wi-Fi module and a Wireless broadband module.

Any of the elements and/or functional blocks disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The processing circuitry may include electrical components such as at least one of transistors, resistors, capacitors, etc. The processing circuitry may include electrical components such as logic gates including at least one of AND gates, OR gates, NAND gates, NOT gates, etc.

In concluding the detailed description, those of ordinary skill in the art will appreciate that many variations and modifications may be made to variously described example embodiments without substantially departing from the principles of the present invention. Furthermore, example embodiments are not necessarily mutually exclusive with one another. For example, some example embodiments may include one or more features described with reference to one or more figures, and may also include one or more other features described with reference to one or more other figures. Therefore, disclosed example embodiments of inventive concepts are used in a generic and descriptive sense only and not for purposes of limitation.

What is claimed is:

1. A test method comprising:
   connecting a memory storage device to a main board;
   connecting a test apparatus to a test pin connected to the memory storage device;
   performing, by the memory storage device, a plurality of initialization operations and changing a resistance value connected to the test pin based on performance results of the plurality of initialization operations; and
   measuring the resistance value and outputting status information of the memory storage device on the basis of the resistance value, by the test apparatus, wherein
   the changing the resistance value includes turning on a first transistor having a source/drain terminal that is connected to a first resistor.

2. The test method of claim 1, further comprising:
   performing debugging of an application processor, a passive element, and a memory storage device connected to the main board, the debugging on the basis of status information of the memory storage device.

3. A memory storage device comprising:
   a memory controller; and
   a status indicating circuit,
   wherein the memory controller is configured to perform a first and a second initialization operation in response to turning-on of the memory storage device, to generate a first status parameter regarding a status of the memory storage device in which the first initialization operation is performed, and to generate a second status parameter regarding the status of the memory storage device in which the second initialization operation is performed,
   the status indicating circuit includes,
   a first transistor which is configured to operate on the basis of the first status parameter,
   a first resistor connected to the first transistor,
   a second transistor which is configured to operate on the basis of the second status parameter, and
   a second resistor connected to the second transistor, wherein
   the first resistor has a first terminal connected to a source/drain terminal of the first transistor.

4. The memory storage device of claim 3, wherein the status indicating circuit is configured to output memory status information indicating resistance values measured on the basis of the first resistor and the second resistor.

5. The memory storage device of claim 4, wherein the memory status information corresponds to a value that is inversely proportional to a sum of a resistance value of the first resistor and a resistance value of the second resistor.

6. The memory storage device of claim 4, wherein the memory status information corresponds to a value that is proportional to the sum of the resistance value of the first resistor and the resistance value of the second resistor.

7. The memory storage device of claim 4, wherein
   both the first resistor and the second resistor are connected to a common node, and
   the memory status information is configured to be output from the common node.

8. The memory storage device of claim 4, wherein
   the first resistor is connected to a node and a first source/drain of the first transistor, and
   the second resistor is connected to a second source/drain of the first transistor and a first source/drain of the second transistor.

9. The memory storage device of claim 3, wherein
   the memory controller is configured to perform a third initialization operation different from the first and second initialization operations, and to generate a third status parameter regarding the status of the memory storage device in which the third initialization operation is performed, and
   the status indicating circuit includes a third transistor that is configured to operate on the basis of the third status parameter, and a third resistor connected to the third transistor.

10. The memory storage device of claim 9, wherein the first resistor, the second resistor, and the third resistor have different resistance values from each other.

11. The memory storage device of claim 3, wherein the status indicating circuit is placed inside the memory controller.

12. The memory storage device of claim 3, wherein the status indicating circuit is placed separately from the memory controller.

13. The memory storage device of claim 3, further comprising:
    a memory device configured to be controlled by the memory controller,
    wherein the status indicating circuit is placed inside the memory device.

14. An operation method of a memory storage device including a status indicating circuit, the operation method comprising:
    performing a first initialization operation on the memory storage device;
    toggling a first status parameter at a first time, on the basis of a first status of the memory storage device in which the first initialization operation is performed;

performing a second initialization operation on the memory storage device;

toggling a second status parameter at a second time following the first time, on the basis of a second status of the memory storage device in which the second initialization operation is performed;

providing the first status parameter and the second status parameter to the status indicating circuit; and switching a first resistor to a second resistor on the basis of toggling of the first status parameter, and switching the second resistor to a third resistor on the basis of toggling of the second status parameter, by the status indicating circuit, wherein the first to third resistors are different from each other, and the first resistor has a first terminal connected to a source/drain terminal of a first transistor.

15. The operation method of the memory storage device of claim 14, wherein toggling of the first status parameter on the basis of the first status of the memory storage device in which the first initialization operation is performed includes, toggling the first status parameter in response to the first status of the memory storage device being normal, and not toggling the first status parameter when the first status of the memory storage device being abnormal.

16. The operation method of the memory storage device of claim 15, further comprising:

not changing the first resistor on the basis of non-toggling of the first status parameter by the status indicating circuit.

17. The operation method of the memory storage device of claim 16, further comprising:

outputting memory status information including a resistance value of the first resistor in response to the first resistor being maintained.

18. The operation method of the memory storage device of claim 15, further comprising:

performing the second initialization operation in response to the toggling of the first status parameter.

19. The operation method of the memory storage device of claim 14, wherein the first resistor is greater than the second resistor and greater than third resistors, and the second resistor is greater than the third resistor.

20. The operation method of the memory storage device of claim 14, further comprising:

outputting memory status information including a resistance value of one of the first to third resistors by the status indicating circuit.

* * * * *